(12) United States Patent
Pain et al.

(10) Patent No.: US 11,232,956 B2
(45) Date of Patent: *Jan. 25, 2022

(54) ELECTROCHEMICAL ADDITIVE MANUFACTURING OF INTERCONNECTION FEATURES

(71) Applicant: FABRIC8LABS, INC., San Diego, CA (US)

(72) Inventors: David Pain, Carlsbad, CA (US); Andrew Edmonds, Oceanside, CA (US); Jeffrey Herman, Solana Beach, CA (US); Charles Pateros, Carlsbad, CA (US); Kareemullah Shaik, San Diego, CA (US)

(73) Assignee: FABRIC8LABS, INC., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/112,909

(22) Filed: Dec. 4, 2020

(65) Prior Publication Data

US 2021/0090901 A1 Mar. 25, 2021

Related U.S. Application Data

(63) Continuation-in-part of application No. 16/941,372, filed on Jul. 28, 2020, now Pat. No. 10,947,632, and
(Continued)

(51) Int. Cl.
*H01L 21/48* (2006.01)
*C25D 1/00* (2006.01)
(Continued)

(52) U.S. Cl.
CPC ............ *H01L 21/485* (2013.01); *C25D 1/003* (2013.01); *C25D 5/10* (2013.01); *C25D 5/22* (2013.01);
(Continued)

(58) Field of Classification Search
None
See application file for complete search history.

(56) References Cited

U.S. PATENT DOCUMENTS

| 4,678,282 A | 7/1987 | Yaniv et al. |
| 5,132,820 A | 7/1992 | Someya et al. |

(Continued)

FOREIGN PATENT DOCUMENTS

| CN | 104178782 A | 12/2014 |
| CN | 204097583 | 1/2015 |

(Continued)

OTHER PUBLICATIONS

Frey et al., "Switch-matrix-based High-Density Microelectrode Array in CMOS Technology", IEEE Journal of Solid-State-Circuits, vol. 45, No. 2, Feb. 2010.
(Continued)

*Primary Examiner* — Louis J Rufo
(74) *Attorney, Agent, or Firm* — Kunzler Bean & Adamson

(57) ABSTRACT

A system and method of using electrochemical additive manufacturing to add interconnection features, such as wafer bumps or pillars, or similar structures like heatsinks, to a plate such as a silicon wafer. The plate may be coupled to a cathode, and material for the features may be deposited onto the plate by transmitting current from an anode array through an electrolyte to the cathode. Position actuators and sensors may control the position and orientation of the plate and the anode array to place features in precise positions. Use of electrochemical additive manufacturing may enable construction of features that cannot be created using current photoresist-based methods. For example, pillars may be taller and more closely spaced, with heights of 200 μm or more, diameters of 10 μm or below, and inter-pillar spacing below 20 μm. Features may also extend horizontally instead
(Continued)

of only vertically, enabling routing of interconnections to desired locations.

22 Claims, 24 Drawing Sheets

Related U.S. Application Data a continuation-in-part of application No. 16/432,857, filed on Jun. 5, 2019, which is a continuation of application No. 15/356,210, filed on Nov. 18, 2016, now Pat. No. 10,465,307.

(60) Provisional application No. 62/890,815, filed on Aug. 23, 2019, provisional application No. 62/983,274, filed on Feb. 28, 2020, provisional application No. 63/069,203, filed on Aug. 24, 2020, provisional application No. 62/257,333, filed on Nov. 19, 2015.

(51) Int. Cl.
  *C25D 5/10* (2006.01)
  *C25D 5/22* (2006.01)
  *B33Y 50/02* (2015.01)
  *B33Y 80/00* (2015.01)
  *B33Y 10/00* (2015.01)
  *B33Y 30/00* (2015.01)

(52) U.S. Cl.
  CPC ...... *H01L 21/4825* (2013.01); *H01L 21/4882* (2013.01); *B33Y 10/00* (2014.12); *B33Y 30/00* (2014.12); *B33Y 50/02* (2014.12); *B33Y 80/00* (2014.12)

(56) References Cited

U.S. PATENT DOCUMENTS

| | | | |
|---|---|---|---|
| 5,998,805 A | 12/1999 | Shi et al. | |
| 6,036,834 A | 3/2000 | Clerc | |
| 7,839,831 B2 | 11/2010 | Vrcelj et al. | |
| 8,681,077 B2 | 3/2014 | Kimura | |
| 9,777,385 B2 | 10/2017 | Wirth et al. | |
| 2001/0014409 A1* | 8/2001 | Cohen | C25D 5/10 428/606 |
| 2004/0129573 A1 | 7/2004 | Cohen | |
| 2005/0176238 A1* | 8/2005 | Cohen | C25D 1/003 438/625 |
| 2005/0183959 A1* | 8/2005 | Wilson | C25D 21/12 205/123 |
| 2005/0202660 A1 | 9/2005 | Cohen et al. | |
| 2005/0223543 A1* | 10/2005 | Cohen | C23C 18/1605 29/602.1 |
| 2007/0089993 A1 | 4/2007 | Schwartz et al. | |
| 2007/0221504 A1 | 9/2007 | Luo | |
| 2011/0210005 A1* | 9/2011 | Van Den Bossche | C25D 21/12 205/82 |
| 2017/0145584 A1* | 5/2017 | Wirth | C25D 17/12 |
| 2019/0160594 A1 | 5/2019 | Flam et al. | |

FOREIGN PATENT DOCUMENTS

| | | | |
|---|---|---|---|
| CN | 204097583 U * | 1/2015 | ............... C25D 1/00 |
| CN | 204097583 U | 1/2015 | |
| CN | 104593830 A | 5/2015 | |
| WO | 2017/087884 | 5/2017 | |
| WO | 2017087884 A1 | 5/2017 | |
| WO | 2019/150362 | 8/2019 | |

OTHER PUBLICATIONS

Stewart et al., "Polysilicon TFT Technology for Active Matrix OLED Displays", IEEE Transactions on Electron Devices, vol. 48, No. 5, May 2001.

International Search Report and Written Opinion received in PCT/US2020/047531, dated Sep. 29, 2020 (6 pages).

Third Party Observation received in PCT/US2020/047531, dated Mar. 16, 2021 (3 pages).

Supplementary International Search Report for International Patent Application No. PCT/US2020/047531 dated Nov. 22, 2021.

* cited by examiner

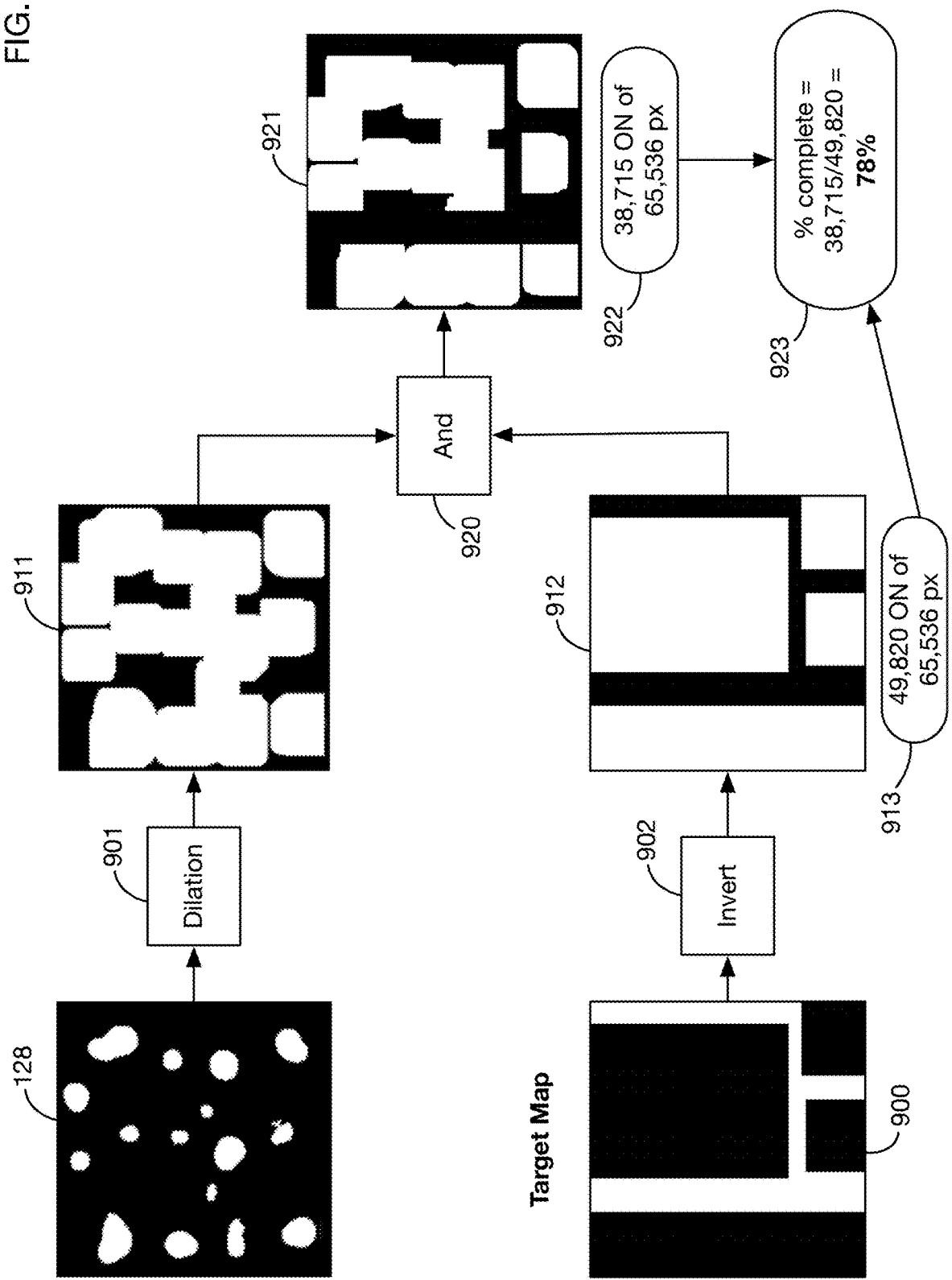

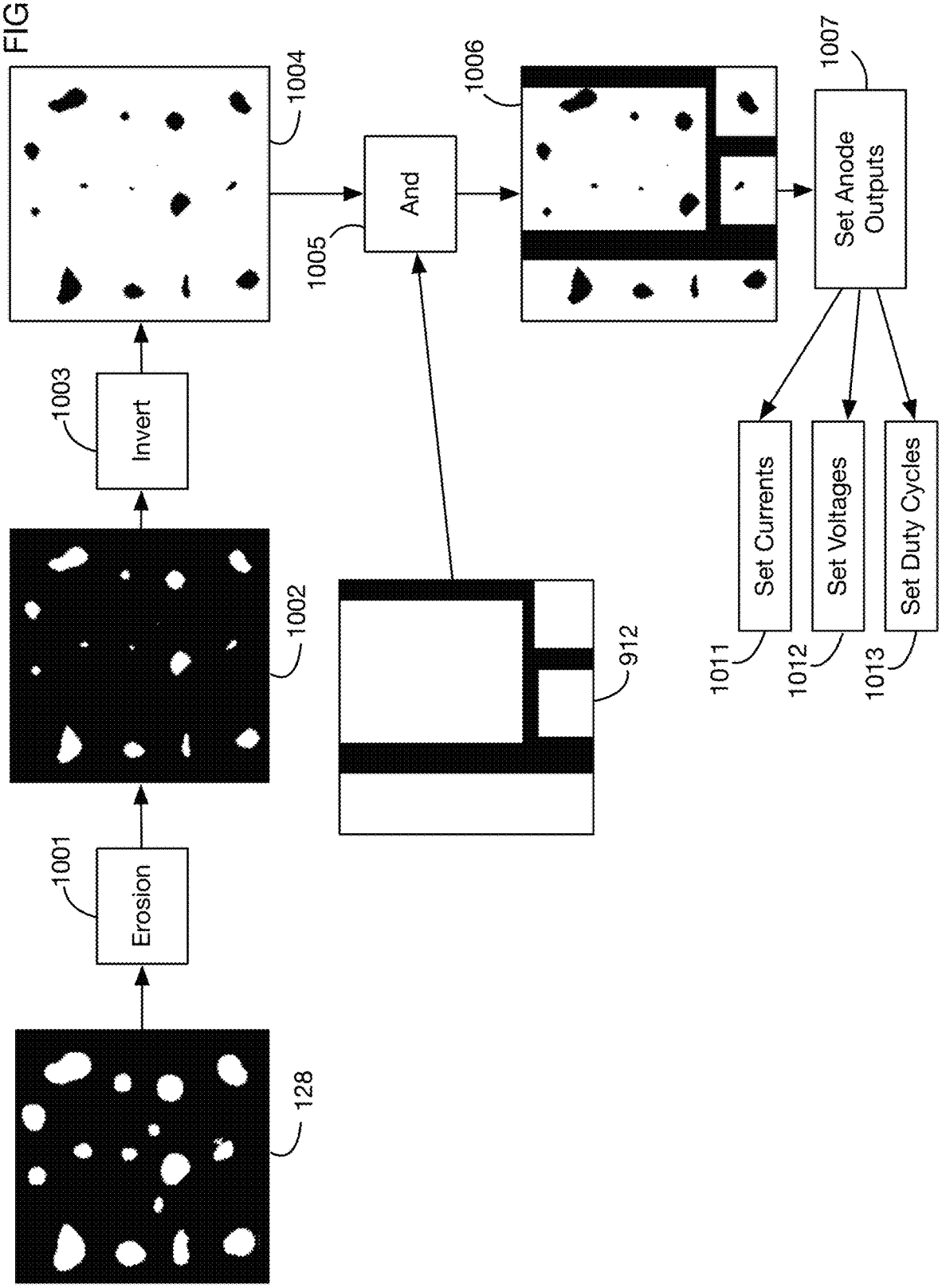

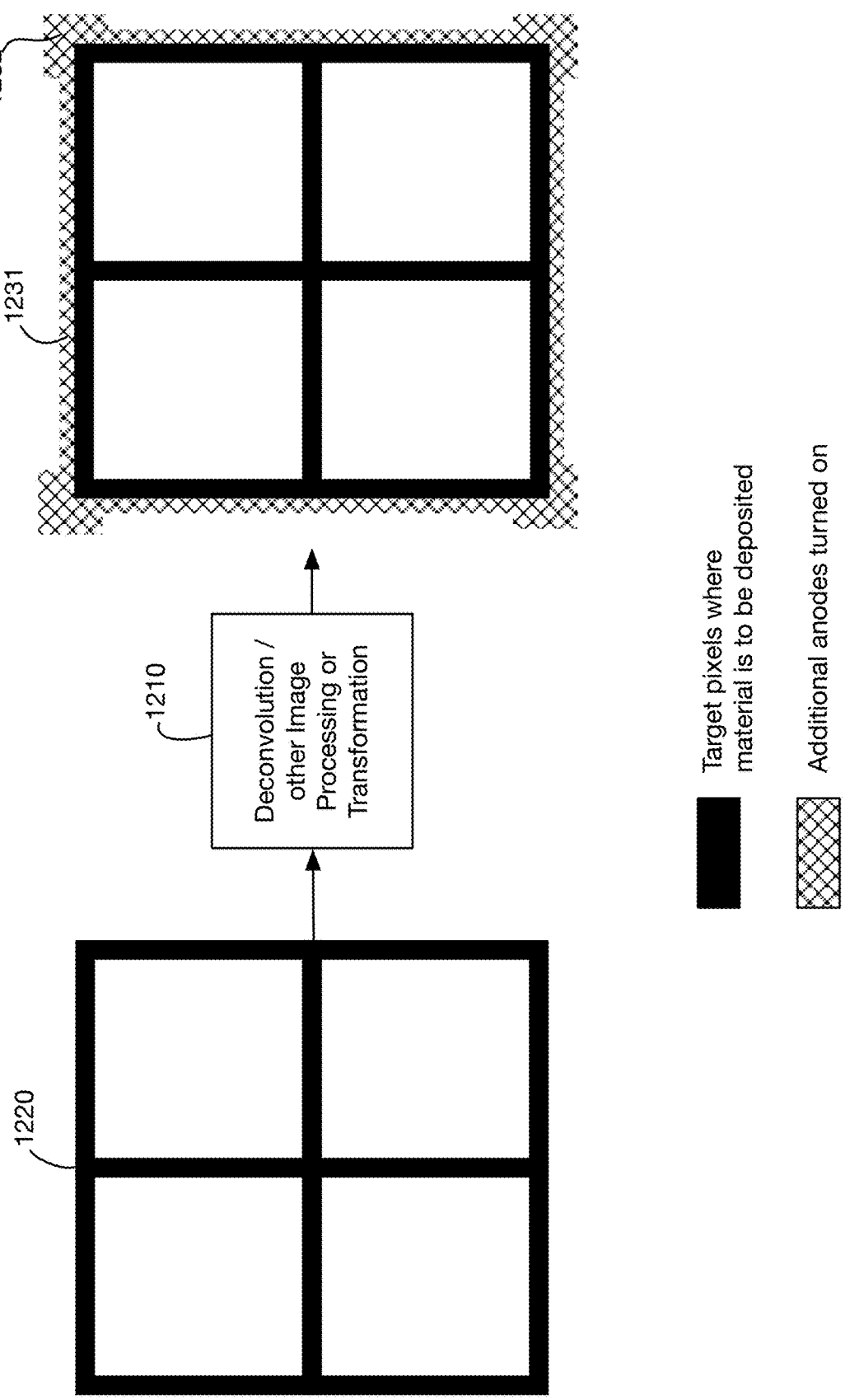

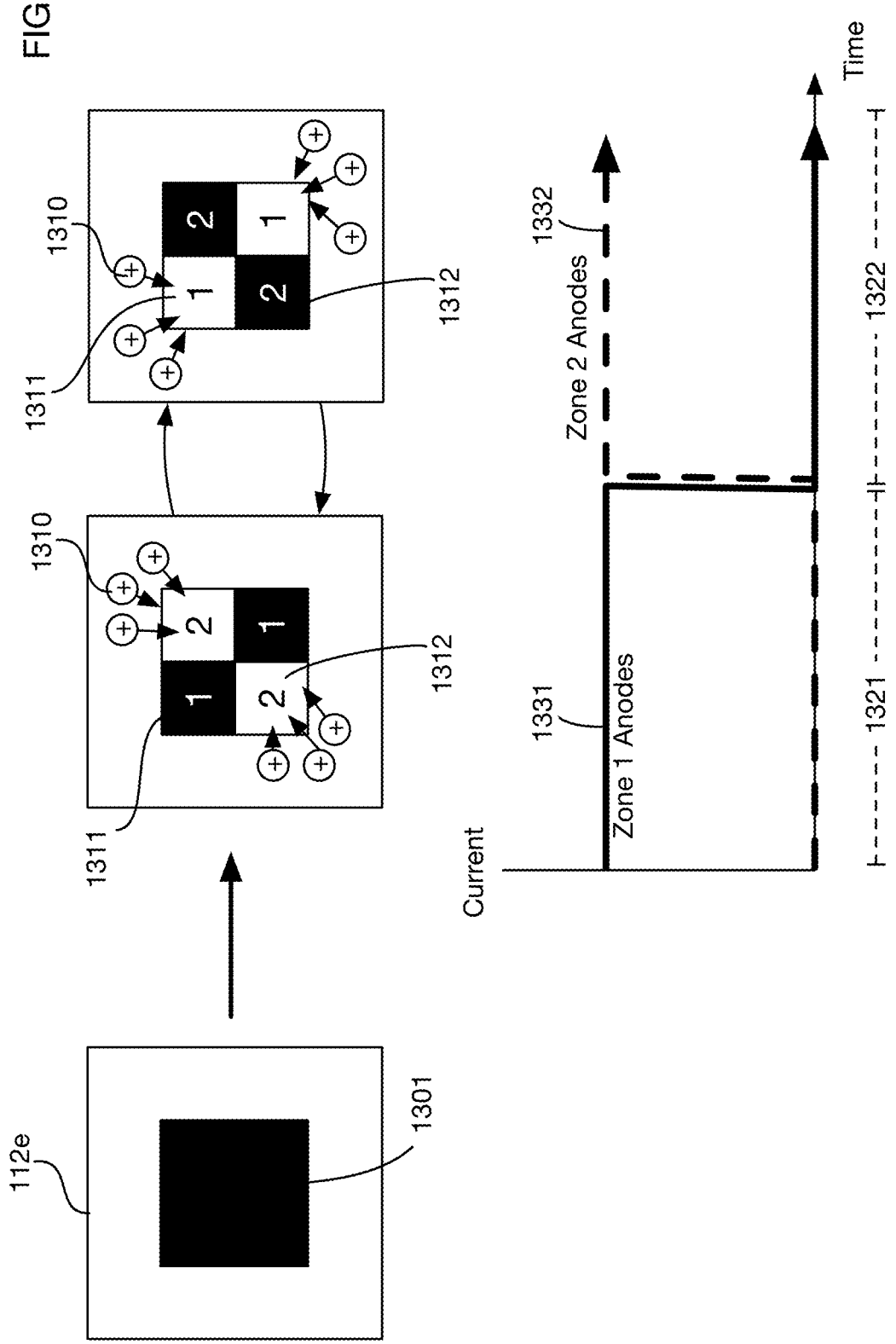

ELECTROCHEMICAL ADDITIVE MANUFACTURING OF INTERCONNECTION FEATURES

This patent application is a continuation-in-part of U.S. Utility patent application Ser. No. 16/941,372, filed 28 Jul. 2020, which claims the benefit of U.S. Provisional Patent Application Ser. No. 62/983,274, filed 28 Feb. 2020 and U.S. Provisional Patent Application Ser. No. 62/890,815, filed 23 Aug. 2019, the specifications of which are hereby incorporated herein by reference.

This application also claims the benefit of U.S. Provisional Patent Application Ser. No. 63/069,203, filed 24 Aug. 2020, the specification of which is hereby incorporated herein by reference.

BACKGROUND OF THE INVENTION

One or more embodiments of the invention are related to the fields of electronics and 3D printing. More particularly, but not by way of limitation, one or more embodiments of the invention enable a system and method of adding interconnection features to a plate using electrochemical additive manufacturing.

Additive manufacturing, also known as 3D Printing, is often used for the production of complex structural and functional parts via a layer-by-layer process, directly from CAD (computer aided drafting) models. Additive manufacturing processes are considered additive because materials are selectively deposited on a substrate to construct the product. Additive manufacturing processes are also typically layered meaning that layers of the product to be produced are fabricated sequentially.

Currently, widespread use of metal additive manufacturing techniques is limited due to the high cost associated with selective laser melting (SLM) and electron beam melting (EBM) systems. Further, most metal additive manufacturing devices currently in the industry use powdered metals which are thermally fused together to produce a part, but due to most metals' high thermal conductivity this approach leaves a rough surface finish because unmelted metal powder is often sintered to the outer edges of the finished product.

An emerging alternative for additive metal manufacturing is to use electrochemical reactions. In an electrochemical manufacturing process, a metal part is constructed by plating charged metal ions onto a surface in an electrolyte solution. This technique relies on placing a deposition anode physically close to a substrate in the presence of a deposition solution (the electrolyte), and energizing the anode causing charge to flow through the anode. This creates an electrochemical reduction reaction to occur at the substrate near the anode and deposition of material on the substrate. An illustrative apparatus that enables additive manufacturing via electroplating is described for example in U.S. Pat. No. 10,465,307, "Apparatus for Electrochemical Additive Manufacturing," by the inventors of the instant application. This apparatus demonstrated a novel approach to electrochemical additive manufacturing that uses a printhead with an array of anodes to build portions of each layer of a part in parallel, instead of moving a single anode across a part to sequentially construct portions of the layer.

BRIEF SUMMARY OF THE INVENTION

Additive manufacturing processes known in the art typically add material in pre-programmed patterns. For example, material may be emitted from a printhead for a preprogrammed period of time at a preprogrammed rate to construct a layer of a part. In electrochemical manufacturing, the rate and pattern of material deposition depends on many dynamic factors, such as the distance between the printhead and each location of the part, the local density of metal ions in the electrolyte, and electrolyte flow patterns. As a result, it is difficult or impossible to achieve high quality parts using strictly preprogrammed ("open loop") control. However, feedback control methods for electrochemical additive manufacturing processes are not well-developed.

One or more embodiments described in the specification are related to an electrochemical additive manufacturing method using deposition feedback control. An object to be manufactured may be constructed by placing a cathode and an anode array into an electrolyte solution. Deposition anodes of the anode array may provide current that flows from the anode to the cathode through the electrolyte solution, resulting in deposition of the material onto the cathode. The manufacturing process may use a build plan with a layer description for multiple layers of the object; each layer description may include a target map, which describes the presence or absence of material at locations within the layer, and one or more process parameters that affect the layer build. Manufacturing of a layer may begin by setting or confirming the position of the cathode relative to the anode array. Then control signals may be sent to the anode array based on the layer description. One or more feedback signals may be measured across the anode array, and these signals may be analyzed to generate a deposition analysis that indicates the extent to which deposition has progressed at locations within the layer. The deposition analysis may be used to determine whether the layer is complete, and to modify the process parameters associated with the layer. When a layer is complete, manufacturing may continue for a subsequent layer.

In one or more embodiments, the layer description of one or more layers may be modified before manufacturing the layers. For example, layer densities may be changed.

Analysis of feedback signals may apply one or more transformations to these signals, such as morphological filters or Boolean operators.

Feedback signals may for example include a map of current across the anode array. The deposition analysis may be generated by applying a thresholding operation to this current map.

Determining whether a layer is complete may for example include comparing the number of actual deposited pixels to the number of desired deposited pixels within the layer. In one or more embodiments, a layer may be complete when the ratio of actual to desired deposited pixels reaches or exceeds a threshold value. In one or more embodiments, a layer may be complete when a desired fraction of the desired deposited pixels are within a threshold distance from an actual deposited pixel. In one or more embodiments, the layer may be divided into components, and completion tests may be applied to each component; a layer may be considered complete when all components are complete. For example, a component may be complete when the ratio of actual to desired deposited pixels within the component reaches or exceeds a threshold value, or when a desired fraction of the desired deposited pixels within the component are within a threshold distance from an actual deposited pixel.

In one or more embodiments, a layer description may include identification of whether a layer has an overhang. Manufacturing of a layer with an overhang may include successively depositing portions of the overhang so that they extend laterally from one or more previously deposited portions.

In one or more embodiments, a layer target map may be divided into regions, and construction of the layer may include alternately activating deposition anodes associated with each region.

In one or more embodiments, manufacturing of a layer may include calculating a map of desired current output from each deposition anode, so that this current output will generate deposition corresponding to the layer's target map. This current map calculation may involve applying one or more transformations to the layer target map.

In one or more embodiments, modification of process parameters associated with a layer may include calculation of voltage, current, or time of activation for one or more deposition anodes.

In one or more embodiments, setting or confirming the position of the cathode relative to the anode may include obtaining sensor signals that vary based on this relative position, such as a current value or a voltage value.

In one or more embodiments, manufacturing of a layer may include one or more maintenance actions that maintain the condition of the anode array or the electrolyte solution. For example, these maintenance actions may replace material onto one or more deposition anodes that have eroded. Maintenance actions may activate one or more deposition anodes to remove a film that has formed. Maintenance actions may include removal of bubbles from the electrolyte solution.

In one or more embodiments, electrochemical additive manufacturing may be used to manufacture one or more interconnection features, such as wafer bumps or pillars, for example. A plate, such as for example a silicon wafer or other substrate, may have one or more tiles, each of which has one or more connection points. The plate may have a conductive seed layer. To construct interconnection features that are electrically coupled to these connection points, the conductive seed layer may be coupled to a power supply, placed into contact with an electrolyte, and aligned with an anode array; the current flowing from each deposition anode of the anode array may be controlled to deposit material onto the plate in the desired locations, forming the desired interconnection features.

Aligning the plate and the anode array may use one or more sensors to determine the three-dimensional position and three-dimensional orientation of the plate relative to the anode array, and using one or more actuators to modify this three-dimensional position and three-dimensional orientation of the plate relative to the anode array.

In one or more embodiments, after depositing material, portions of the conductive seed layer not covered by interconnection features may be removed. In one or more embodiments, the initial conductive seed layer may be thickened using electrodeposition.

In one or more embodiments, some or all of the interconnection features may have portions that are not substantially perpendicular to the plate; for example, they may extend horizontally. These portions may be constructed by successively activating horizontally offset anodes to grow the deposit horizontally. In one or more embodiments, a vertical portion of one or more features may be deposited, followed by deposition of an inert material onto the plate to provide support for subsequent horizontal portions. In one or more embodiments, non-perpendicular features may be constructed by rotating the plate so that the previously constructed vertical segments become horizontal, and depositing the subsequent portions vertically.

In one or more embodiments, the anode array may be successively placed in position near different sets of tiles to construct interconnection features for each tile.

One or more embodiments of the invention may include an electrochemical additive manufacturing system, which may be used for example to create interconnection features. The system may have a reaction chamber that contains an ionic solution that can be decomposed by electrolysis. It may have an anode array disposed in the reaction chamber and configured to be immersed in the ionic solution. It may have a substrate disposed in the reaction chamber, where a conductive seed layer on a surface of the substrate is configured to be in contact with the ionic solution. It may have a mechanical positioning system that is configured to modify one or more of the position and orientation of one or both of the anode array and the substrate. It may have a microcontroller that is programmed to transmit control signals to the mechanical positioning system to modify the relative position and orientation of the anode array and the substrate so that the anode array and the substrate are substantially coplanar, and the anode array is aligned with one or more features of the substrate. The microcontroller may also accept a three-dimensional model of interconnection features to be added to the substrate. Based on this model, the microcontroller may control the current through each anode of the anode array to construct the interconnection features on the substrate.

One or more embodiments of the electrochemical additive manufacturing system may include one or more attachments that are configured to provide an electrical connection to the conductive seed layer.

In one or more embodiments of the electrochemical additive manufacturing system, the substrate may have two or more tiles. The microcontroller may successively position the anode array relative to the substrate to step through the tiles. For example, it may transmit a first set of control signals to the mechanical positioning system to align the anode array with a first tile of the two or more tiles, and then control the current through each anode of the anode array to construct the interconnection features on the first tile. Afterwards it may transmit a second set of control signals to the mechanical positioning system to align the anode array with a second tile of the two or more tiles, and then control the current through each anode of the anode array to construct the interconnection features on the second tile.

BRIEF DESCRIPTION OF THE DRAWINGS

The above and other aspects, features and advantages of the invention will be more apparent from the following more particular description thereof, presented in conjunction with the following drawings wherein:

FIG. 9A shows an illustrative method to test for layer completion based on the current sensor data of FIG. 8.

FIG. 10 illustrates update of anode outputs based on the current sensor feedback signals of FIG. 8.

FIG. 12B shows an illustrative two-dimensional example of calculating a pattern of anode currents to obtain a desired deposition pattern.

FIG. 13 shows an illustrative embodiment that alternates anode output across different regions.

FIG. 22A illustrates non-independent electrodes, non-independently controlled; FIG. 22B illustrates independent electrodes, non-independently controlled; and FIG. 22C illustrates independent electrodes, independently controlled.

DETAILED DESCRIPTION OF THE INVENTION

A system and method of adding interconnection features to a plate using electrochemical additive manufacturing will now be described. One or more embodiments of the invention may enable manufacturing of objects by passing electrical current through an electrolyte to deposit material onto the object, and by monitoring feedback signals during deposition to adjust manufacturing process parameters throughout the process. In one or more embodiments, the object to be manufactured may be for example a plate, such as a silicon wafer, to which interconnection features (such as wafer bumps) may be added. In the following exemplary description, numerous specific details are set forth in order to provide a more thorough understanding of embodiments of the invention. It will be apparent, however, to an artisan of ordinary skill that embodiments of the invention may be practiced without incorporating all aspects of the specific details described herein. In other instances, specific features, quantities, or measurements well known to those of ordinary skill in the art have not been described in detail so as not to obscure the invention. Readers should note that although examples of the invention are set forth herein, the claims, and the full scope of any equivalents, are what define the metes and bounds of the invention.

In an electrochemical additive manufacturing process, a metal part is constructed by reducing charged metal ions onto a surface in an electrolyte solution. This technique relies on placing a deposition anode physically close to a substrate in the presence of a deposition solution (the electrolyte), and energizing the anode causing charge to flow through the anode. This creates an electrochemical reduction reaction to occur at the substrate near the anode and deposition of material on the substrate. A particular challenge of electrochemical manufacturing is that the rate and quality of deposition of material may be highly variable, and may vary across time and across locations based on multiple factors such as current density, electrolyte composition, fluid flows within the electrolyte, and distances between anodes and previously deposited material. For this reason, the inventors have discovered that an important factor in constructing high-quality parts with electrochemical additive manufacturing is to employ a "closed loop" feedback control system that monitors deposition throughout the manufacturing process, and that adjusts manufacturing parameters accordingly. This approach contrasts with a typical "open loop" additive manufacturing process used by most 3D printers, for example, where layers are constructed successively based on pre-programmed commands.

Figure 1:
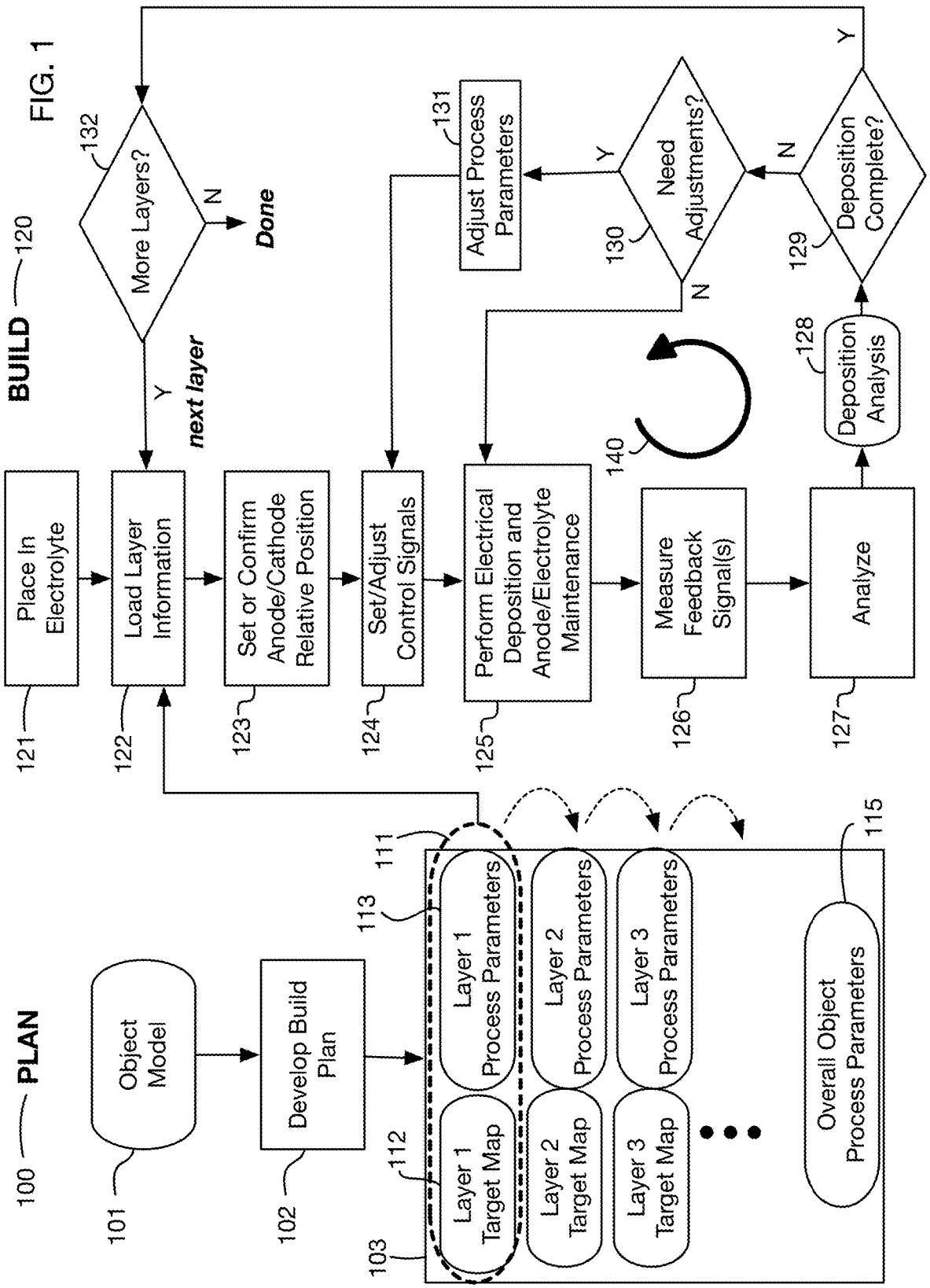
FIG. 1 shows a flowchart of an embodiment of the invention that successively manufactures layers using feedback control to assess layer completion and to adjust parameters during manufacturing.

FIG. 1 shows illustrative steps for an electrochemical additive manufacturing process that incorporates deposition feedback control. These steps are illustrative; one or more embodiments may use different or additional steps and may perform operations in different orders. The manufacturing process illustrated in FIG. 1 has a planning phase 100, and a building phase 120. In the planning phase 100, a model 101 of an object is analyzed by planning step or steps 102 to generate a build plan 103 for construction of the object. The planning step or steps 102 may execute on any processor or processors, such as for example, without limitation, a computer, a microprocessor, a microcontroller, a desktop, a laptop, a notebook, a server, a mobile device, a tablet, or a network of any of these processors. In one or more embodiments, the planning step (or steps) 102 may for example slice a 3D object model 101 into layers, and develop a plan to construct each layer. The build plan 103 may include a layer description for each layer; a layer description may include for example a target map for the layer and various process parameter values for construction of the layer. The target map may include a two-dimensional grid or image showing locations within the layer where material is to be deposited. The process parameters for a layer may include any variables that affect the physical or electrical processes that construct the layer; these parameters may include for example, without limitation, current density range, voltage range, layer height, movement parameters, overhang controls, safety thresholds, leakage thresholds, short circuit determination threshold values, pixel mapping intervals and thresholds, debubble values, fusing, anode cleaning, islanding, distance to short, distance to short percentage, pixel limits, slow current control values, and maximum blob size. FIG. 1 shows an illustrative layer description 111 for a first layer of an object, which includes a target map 112 for the layer and process parameters 113 for the layer; subsequent layers have similar layer descriptions with target maps and process parameters. The build planning step or steps 102 may also generate overall process parameters 115 that apply to all of the layers in the build, or that may be used as default values that apply unless a layer description overrides the defaults.

The build phase 120 of the process constructs an object from the build plan 103, using for example equipment that performs electrochemical deposition. Illustrative equipment that may be used in one or more embodiments of the invention is described below with respect to FIG. 2. To initiate the build process, a surface of a cathode may be placed in contact with an electrolyte solution in step 121; the object may be constructed by electrochemically depositing material onto the cathode by passing current through an anode array that is also in contact with the solution. Layers in build plan 103 may then be built successively onto the base of the cathode or onto previously constructed layers, effectively enlarging the cathode for purposes of deposition. For each layer in the build plan, the layer description is retrieved or loaded in step 122. The layer description may for example be loaded into a memory accessible to a controller of the electrochemical deposition equipment; this controller may be any type or types of processors. For example, to start object construction, the first layer description 111 may be loaded or retrieved. The controller may then perform step 123 to set or confirm the relative position between the anode and the cathode. As layers are successively built, the distance between the anode and the cathode may need to be modified so that the anode distance from the most recently deposited surfaces remains within a range that enables sufficient control of the deposition process. For example, the electrochemical deposition equipment may include an actuator that can move either or both of the cathode and the anode, as illustrated below with respect to FIG. 2. For the first layer, step 123 may for example involve a "zeroing" procedure that sets the initial relative position between the anode and the cathode to a desired initial value. The specific methods used for zeroing may vary depending on the deposition equipment. For example, in one or more embodiments the controller may move the cathode or anode until one or more sensors indicate contact (or sufficiently close proximity) between the two, and it may then offset a desired distance from this contacting position. In one or more embodiments there may be sensors such as absolute or relative encoders on the position actuator that assist in zeroing.

For layers after the first layer, step 123 may ensure that the relative position between the anode and cathode is correct to begin deposition of material for the new layer. In some cases this may require modifications to the relative position, for example using an actuator that moves the anode or the cathode. For example, in some situations an object may be constructed by successively depositing material for a layer, then repositioning the cathode relative to the anode to move the cathode away from the anode to prepare for the next layer, and then depositing material for the next layer. In other situations relative movement between the anode and cathode may be performed throughout construction of a layer, sometimes referred to as "gliding," so that no additional repositioning is required at step 123 when a new layer is loaded.

After a layer description is loaded in step 122, and the relative position of the cathode and anode is set or confirmed in step 123, the build process 120 enters an inner loop 140 of steps that may be executed to construct the loaded layer. As described above, this loop may be a closed loop with feedback control, so that build steps and process parameters may be modified throughout the loop based on measured feedback signals. Step 125 may include various actions to deposit material via electrochemical reactions (for example, by passing current through anodes) as well as actions that maintain or adjust the state or health of the anode array and the electrolyte. Illustrative maintenance actions may include for example, without limitation, removal of bubbles from the electrolyte, agitation of the electrolyte to modify flow rates or to modify distribution of ions in the electrolyte, and actions to remove films from anodes or to replenish anode surfaces. Any of these maintenance actions may be interleaved with deposition actions in any desired manner.

At selected times or periodically during the construction of a layer, step 126 may be performed to obtain feedback signals that may for example indicate how deposition is progressing. One or more embodiments may use any type or types of sensors to obtain feedback signals. For example, in one or more embodiments the current through each anode in an anode array may be measured (for example with a fixed voltage); a higher current may correspond to a lower impedance between the anode and the cathode, which may be correlated with the amount of material deposited on the cathode in the vicinity of each anode. In other embodiments, a variable voltage waveform may be used, and alternating current (AC) signals may be measured. One or more embodiments may use other feedback signals such as optical images of the cathode or distance measurements to points on the cathode. In step 127 these feedback signals may be analyzed to generate a deposition analysis 128, which may include estimates of the amount of material deposited at locations within the layer. Based on the deposition analysis 128, a determination 129 may be made as to whether construction of the layer is complete. If the layer is complete, and if test 132 indicates that there are more layers to be constructed, then a next layer is loaded in step 122 and the layer construction loop 140 is executed for that next layer; otherwise construction of the object is finished. In some embodiments, the generation of deposition maps may be performed concurrently with the deposition process. For example, additional sensing elements may be incorporated into the fabrication of the anode array to enable continuous characterization of the current flowing through each deposition anode, or the voltage at each deposition anode surface. This could be performed, for instance, by an Analog to Digital converter (ADC) whose inputs are sequentially connected to successive rows of deposition anodes in a multiplexing method similar to that used in the addressing of the anode array.

If test 129 indicates that deposition for a layer is not complete, then in some situations the deposition analysis 128 or other data from the feedback signals may be used to modify the parameters and control signals that are used to construct the layer. A test 130 may be performed to determine whether any adjustments are required. If they are required, then one or more process parameters 131 may be modified, and this may modify the control signals 124 that drive the deposition (and maintenance) actions. As one example, if the deposition analysis 128 indicates that enough material has been deposited in certain areas of a layer, then current may be turned off (or turned down) for anodes corresponding to those areas.

Figure 2:
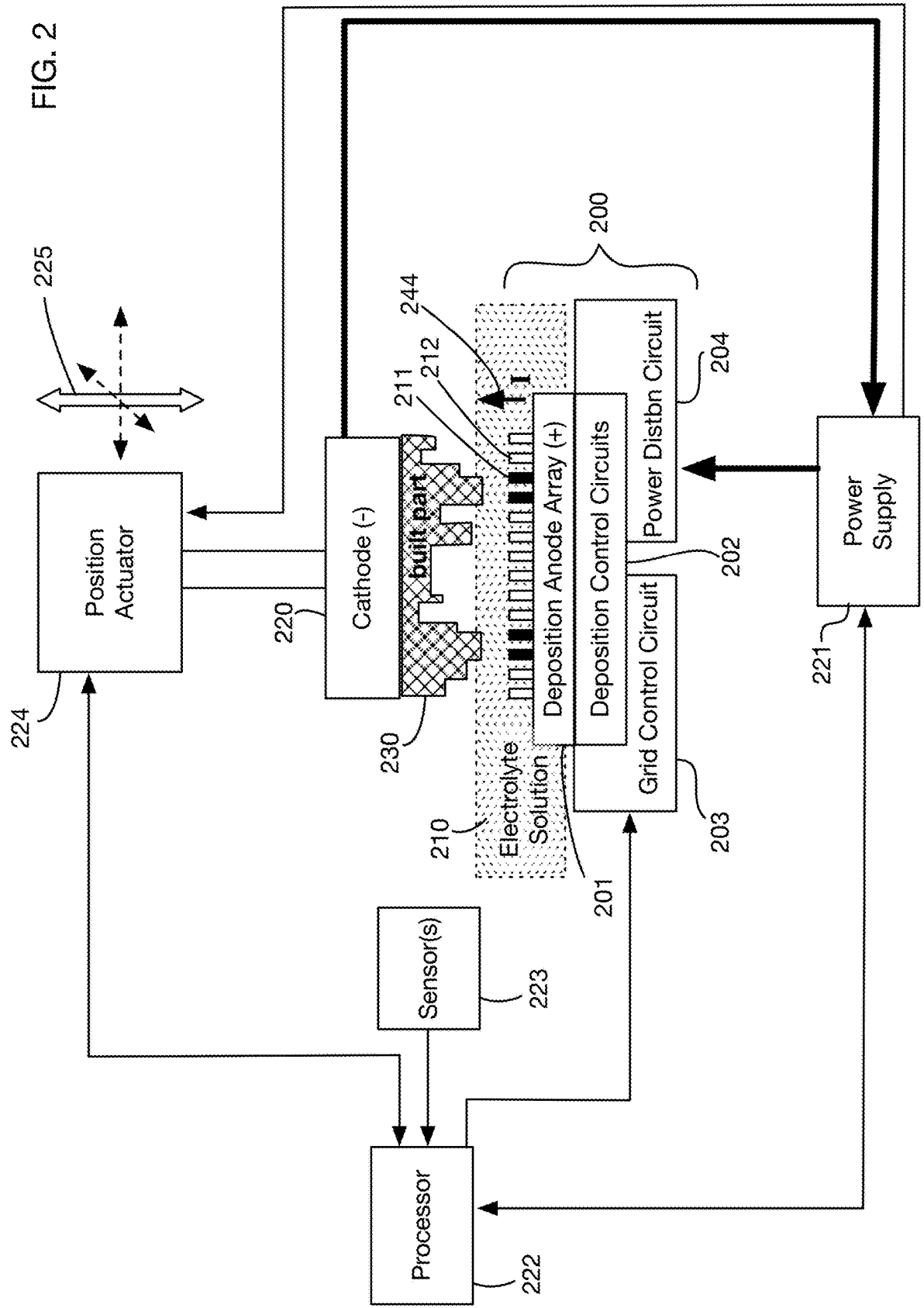
FIG. 2 shows an architectural block diagram of illustrative electrodeposition equipment that may be used to implement one or more embodiments of the invention.

FIG. 2 shows an architectural diagram of illustrative equipment that may be used to perform build steps of one or more embodiments of the invention. The system has a printhead 200 that contains an array 201 of deposition anodes, and a corresponding array 202 of deposition control circuits for the deposition anodes. In one or more embodiments, the deposition control circuits 202 may be organized in a matrix arrangement, thereby supporting high resolution anode arrays. The deposition anode array 201 may be organized in a two-dimensional grid; FIG. 2 shows a cross sectional view. A grid control circuit 203 transmits control signals to the deposition control circuits 202 to control the amount of current flowing through each deposition anode in anode array 201. Current flowing through the anodes is provided by a power distribution circuit 204 that routes power from one or more power supplies 221 to the deposition control circuits and then to the anodes. Printhead 200 may also contain other elements such as insulation layers, for example to protect elements of the printhead from the electrolyte solution.

The deposition anode array 201 of printhead 200 may be placed in an electrolyte solution 210. Electrochemical reactions may then cause plating of metal onto a manufactured part 230 that is coupled to cathode 220. Intricate and detailed shapes may be built in part 230 by modifying the current flowing through each anode of deposition anode array 201. For example, in the snapshot shown in FIG. 2, anode 211 is energized, so that metal is being deposited onto part 230 near this anode, but anode 212 is not energized so no metal is being deposited near that anode.

In one or more embodiments, printhead 200 may be integrated with a processor 222. This processor may transmit signals to grid control circuit 203, which sends signals to the individual deposition control circuits 202 to turn anodes in deposition anode array 201 on or off (or to modify the intensity of current flow through each anode). Processor 222 may be for example, without limitation, a microcontroller, a microprocessor, a GPU, a FPGA, a SoC, a single-board computer, a laptop, a notebook, a desktop computer, a server, or a network or combination of any of these devices. Processor 222 may be the same as or different from a processor or processors that analyze an object model to construct a build plan. Processor 222 may communicate with one or more sensors 223 that may generate the feedback signals that measure the progress of metal deposition on part 230. Sensors 223 may include for example, without limitation, current sensors, voltage sensors, timers, cameras, rangefinders, scales, force sensors, or pressure sensors. One or more of the sensors 223 may also be used to measure the distance between the cathode and the anode, for example for zeroing to begin manufacturing an object, or to set or confirm the relative position between the anode and cathode at the beginning of each layer. The accurate positioning of the build plate relative to the electrode array at the initialization of the deposition process may have a significant impact on the success and quality of the completed deposit. Embodiments may use various types of sensors for this positioning, including for example, without limitation, mechanical, electrical, or optical sensors, or combinations thereof. In one or more embodiments, mechanical sensors such as a pressure sensor, switch, or load cell may be employed, which detects when the build plate is moved and reaches the required location. In one or more embodiments, portions of the system may be energized, and the cathode may be moved to proximity to the energized component at a known location. When a voltage or current is detected on the cathode or build plate the build plate may be known to be at a given location. One or more embodiments may use other types of sensors that detect for example capacitance, impedance, magnetic fields, or that utilize the Hall Effect to determine the location of the cathode/build plate relative to a known position. One or more embodiments may use optical sensors such as laser rangefinders or sensors that detect interference with an optical path.

Either or both of cathode 220 and printhead 200 may be attached to one or more position actuators 224, which may control the relative position of the cathode and the deposition anode array. Position actuator 224 may control vertical movement 225, so that the cathode may be raised (or alternatively the anode lowered) as the part 230 is built in successive layers. In one or more embodiments position actuator 224 may also move the cathode or deposition anode array horizontally relative to one another, for example so that large parts may be manufactured in tiles. The tiles may correspond to semiconductor dies. In some embodiments, a number of tiles may correspond to the same semiconductor die patterns. In some embodiments, different interconnect structures may be built on top of the same type of die, enabling customization of the resulting chips, even when the underlying dies are of the same pattern.

Printhead 200 may be connected to a power supply (or multiple power supplies) 221, which supplies current 244 that flows through the deposition anode array to drive metal deposition on part 230. Current may be distributed throughout the array of deposition control circuits via power distribution circuit 204, which may for example include one or more power busses.

In one or more embodiments, the system may also include a fluid chamber to contain the electrolyte solution (not shown in FIG. 2), and a fluid handling system (also not shown). The fluid system may include for example a tank, a particulate filter, chemically resistant tubing and a pump. Analytical equipment may enable continuous characterization of bath pH, temperature, and ion concentration using methods such as conductivity, High Performance Liquid Chromatography, mass spectrometry, Cyclic Voltammetry Stripping, spectrophotometer measurements, or the like. Bath conditions may be maintained with a chiller, heater and/or an automated replenishment system to replace solution lost to evaporation and/or ions of deposited material.

Although the system shown in FIG. 2 has a single array of deposition anodes, one or more embodiments may incorporate multiple deposition anode arrays. These multiple anode arrays may for example operate simultaneously in different chambers filled with electrolyte solution, or they may be tiled in a manner where the anode arrays work together to deposit material on a shared cathode or series of cathodes.

Figure 3:
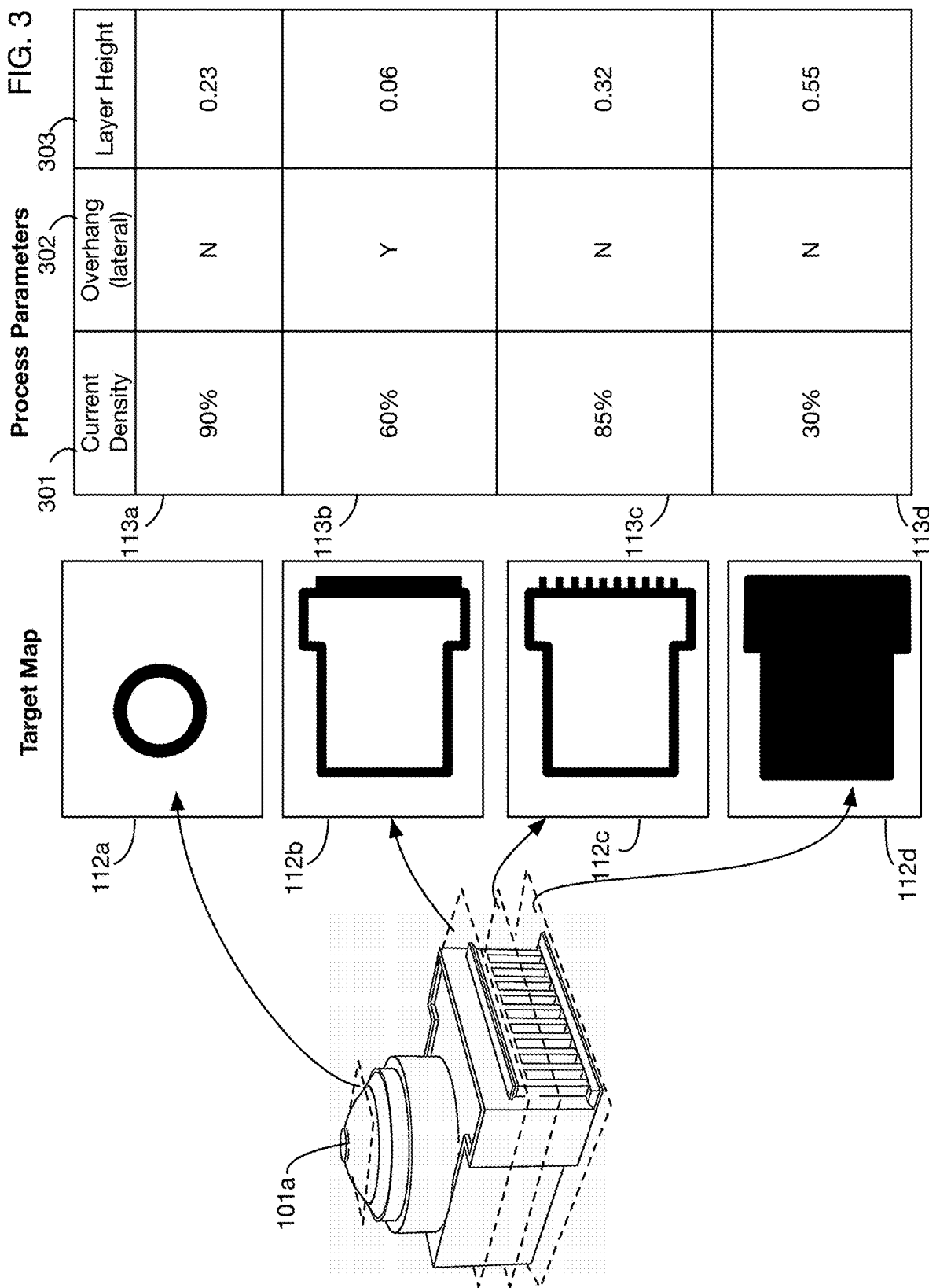
FIG. 3 shows an illustrative build plan for layers of an object, with target maps for each layer showing desired areas of deposited material, and process parameters describing how the layer is to be manufactured.

FIG. 3 shows illustrative elements of a build plan for an object with an object model 101a. The object model 101a may be for example a 3D CAD model, or any description of the geometric or material properties of an object. The build planning process may slice this model into layers, and may develop a layer description for each layer. FIG. 3 shows four illustrative layers, each of which corresponds to a horizontal slice through model 101a. Build plans may have any number of layers and slices may be of any desired thickness, shape, and orientation. Associated with each layer is a layer description that includes a target map, and one or more process parameters. The four layers shown in FIG. 3 have target maps 112a through 112d, and process parameters 113a through 113d, respectively. The target map may for example be a two-dimensional image that shows where material is to be deposited in the layer. In FIG. 3 the target maps are shown with black pixels indicating that material is to be deposited at the corresponding layer position, and white pixels indicating that no material is to be deposited. In one or more embodiments the target map may have non-binary values at positions; for example, target maps may be described as grayscale images. In one or more embodiments, target maps may have additional information such as the type of material or materials to be deposited at each location.

FIG. 3 shows three illustrative process parameters 301 through 303 for each layer. One or more embodiments may associate any number of process parameters with layer descriptions. A process parameter may describe any factor that affects the manufacturing of a layer or that affects any maintenance activities to be performed. Illustrative parameter 301 defines the current density that may be set to construct the layer, which is specified for example as a percentage of the maximum current density supported by the manufacturing equipment. Illustrative parameter 302 indicates whether a layer may require lateral deposition of material. This parameter may be based on whether the build planning system detects overhangs, as described below with respect to FIG. 6. For layers that do not require lateral deposition, in one or more embodiments the manufacturing system may reposition the cathode vertically relative to the anode throughout the manufacturing of the layer, so that deposited material remains at a relatively fixed distance from the anode as it accumulates on the layer; this "gliding" movement may for example reduce the chance of short-circuits developing between the anode and the cathode. Illustrative parameter 303 is the target height of the layer. In some situations the layer height may be higher on initial layers (such as layer 112d) to allow for easier bubble clearing. Layers with overhangs (such as layer 112b) may have lower heights to allow them to build with more dimensional stability, for example.

Process parameters for a layer may also include the target output from each anode in the anode array when constructing the layer. In simple situations this output may match the target map for the layer: anodes may be turned on if they are in the position where material is to be deposited, and turned off otherwise. In other situations the relationship between anode output and the target map may be more complex, as illustrated for example below with respect to FIGS. 11A, 11B, 11C, and 12.

Figure 4:
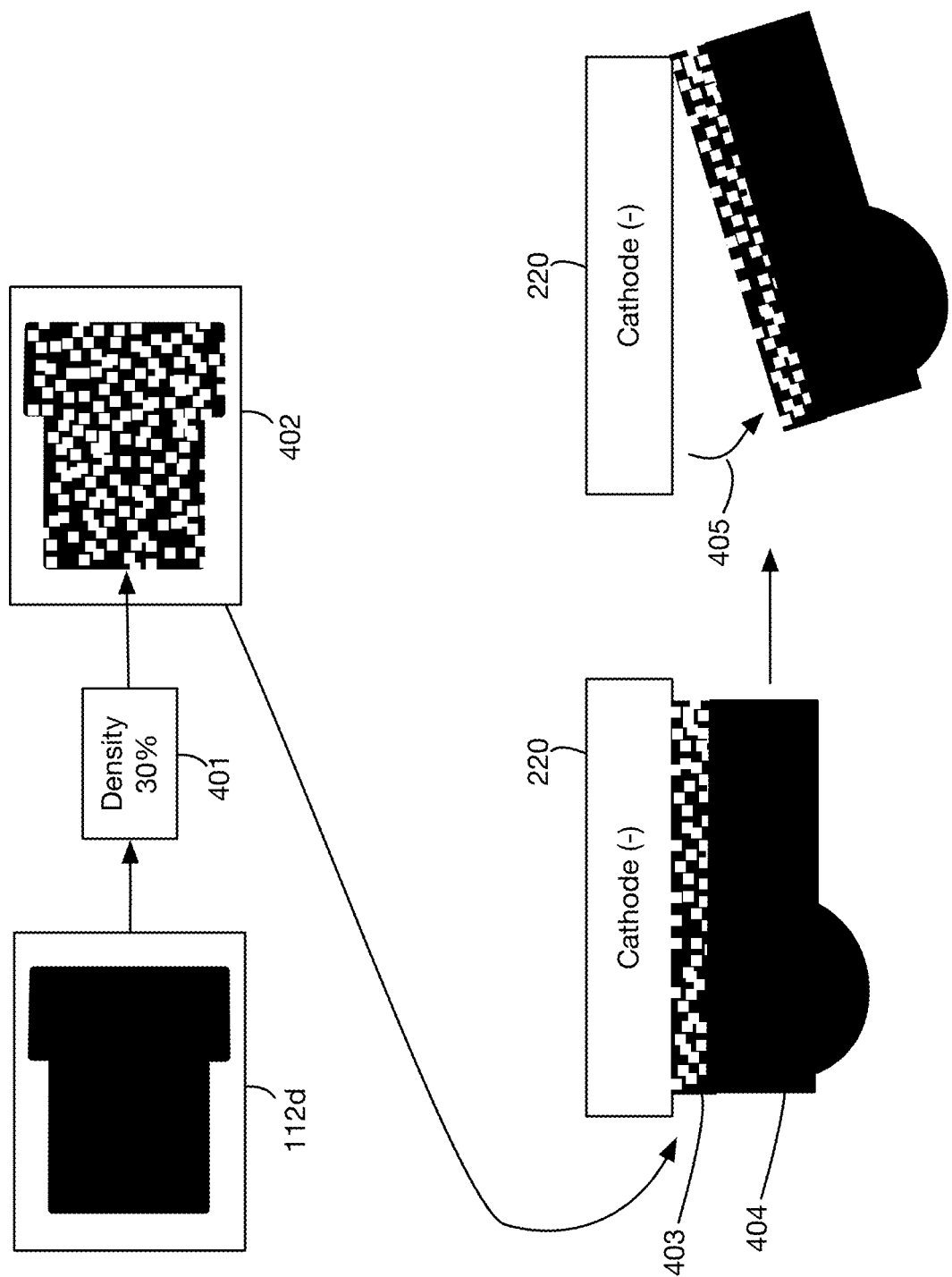
FIG. 4 illustrates density manipulation to generate a porous base layer that facilitates part removal.

FIG. 4 illustrates density manipulation on the base layer 112d of object 101a. This layer is added first to the cathode, and other layers are then constructed on top of the base layer. For a base layer (or a set of base layers) in particular, it may be beneficial to reduce the layer density to make the layer porous. The porosity of the layer may make it easier to remove the object from the cathode after manufacturing is complete. Density may be reduced by manipulating the target map to reduce the number of pixels where material is to be deposited. For example, deposition may be turned off at random positions with a probability equal to 100% less the target density. In FIG. 4, the density 401 parameter is applied to the original target map 112d to generate a modified target map 402, where 70% of the pixels of the original target map have been turned off ("off" pixels are shown as white in the image). This modified target map 402 results in base layer 403 deposited onto cathode 220 (shown as a vertical cross section in FIG. 4). Additional layers 404 are constructed on top of the base layer to form the complete part. Removal 405 of the part from the cathode 220 may be facilitated by the porosity of the base layer 403.

Figure 5:
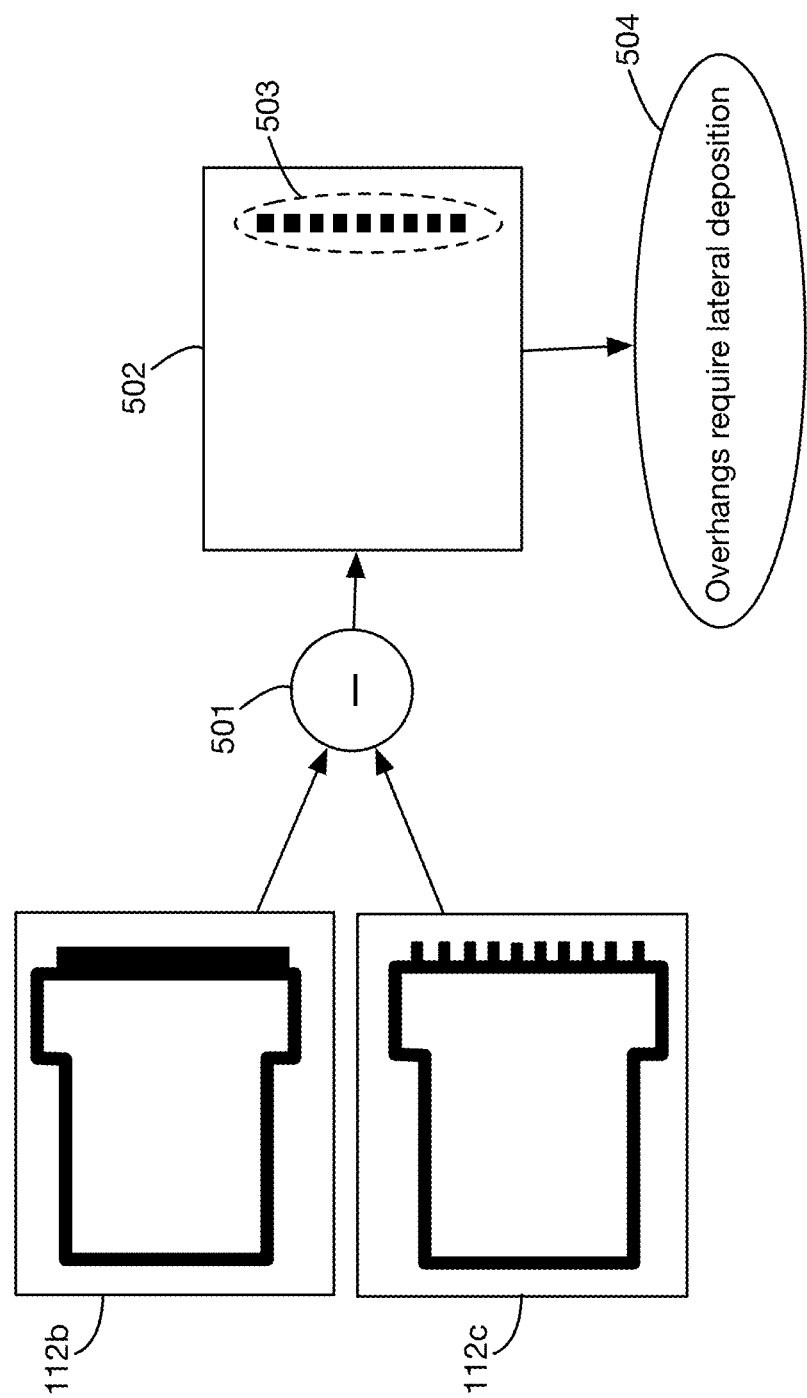
FIG. 5 illustrates detection of an overhang in a layer.
Figure 6:
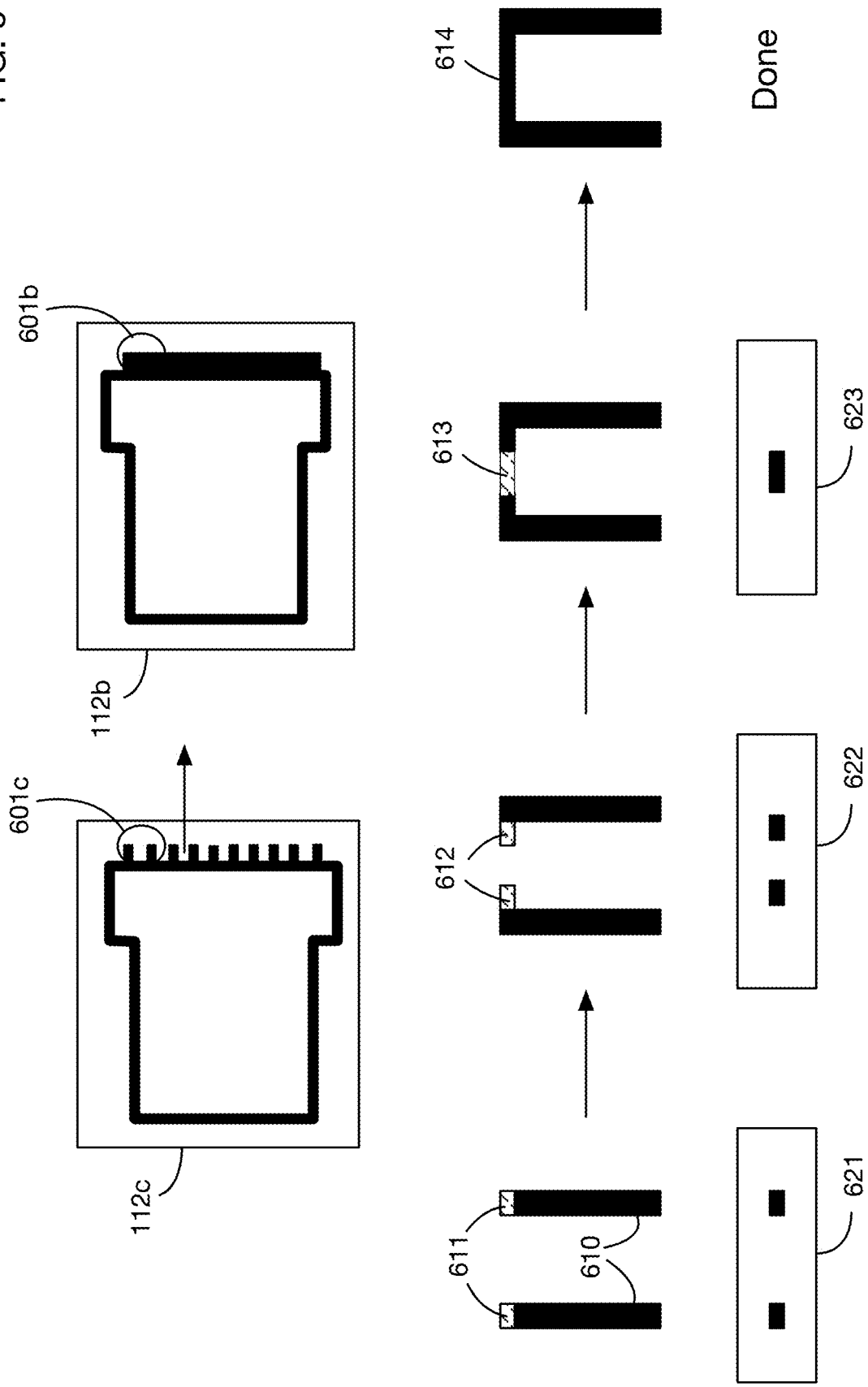
FIG. 6 illustrates manufacturing steps for the overhang detected in FIG. 5.

FIGS. 5 and 6 show illustrative build planning and manufacturing for a layer that has significant overhang. Overhangs are features that extend horizontally without material to support them in the layer below. In traditional 3D printing with plastics, supports must often be added explicitly to support these overhangs, and then removed in a post-production step. For electrochemical additive manufacturing, many overhangs can be constructed directly, without supports, since metal ions can accumulate laterally and fuse to the overhang structure with sufficient strength that underlying supports may be unnecessary. FIG. 5 illustrates how overhangs may be identified in one or more embodiments. The target map 112b of a layer may be compared to the target map 112c of the layer underneath (or to several such layers), for example with a differencing operation 501. This comparison yields a delta map 502, which shows areas 503 where material is being added without material below. If the size of these areas within 503 are sufficiently large, the build planning system may make a determination 504 that the overhangs require special processing such as lateral construction, as illustrated in FIG. 6. FIG. 6 shows illustrative steps to manufacture a small portion 601b of the overhang of layer 112b above area 601c in the layer 112c below. This portion 601b is effectively a "bridge" that rests on two supporting columns below. The columns 610 have been constructed in previous layers, with the top of these columns corresponding to region 601c of target map 112c. Construction of the bridge proceeds in three illustrative sub-steps within layer 112b. First, material 611 is added on top of columns 610; this sub-step corresponds to a subset 621 of the target map 112b. Second, material 612 is added laterally out from the columns, corresponding to a subset 622 of the target map 112b. Third, material 613 is added laterally in the middle, corresponding to a subset 623 of the target map 112b, resulting in final structure 614. The number of lateral build steps required may vary based for example on the size of the overhang and on the binding strength of the material.

In one or more embodiments, overhang processing may also include reducing the height of layers in the regions of overhangs in order to achieve the deposit required. This may be done for example by changing the layer height to make the overhang distance match some ratio of the pixel pitch. For example, with a 45 degree overhang and a pixel pitch of 50 um, the layer height may be set to 50 um, which will cause the overhang distance to be 50 um (1 pixel width). On a 60 degree overhang, the layer height would be ~29 um in order to have an overhang distance of 50 um. These two examples show a 1:1 ratio, where the overhang distance is increased by 1 pixel per layer. For a 2:1 ratio, the layer heights would be doubled, resulting in an overhang distance of 100 um or 2 pixels for each layer. This may be done because it results in a more stable and consistent build of the overhang regardless of overhang angle.

Figure 7:
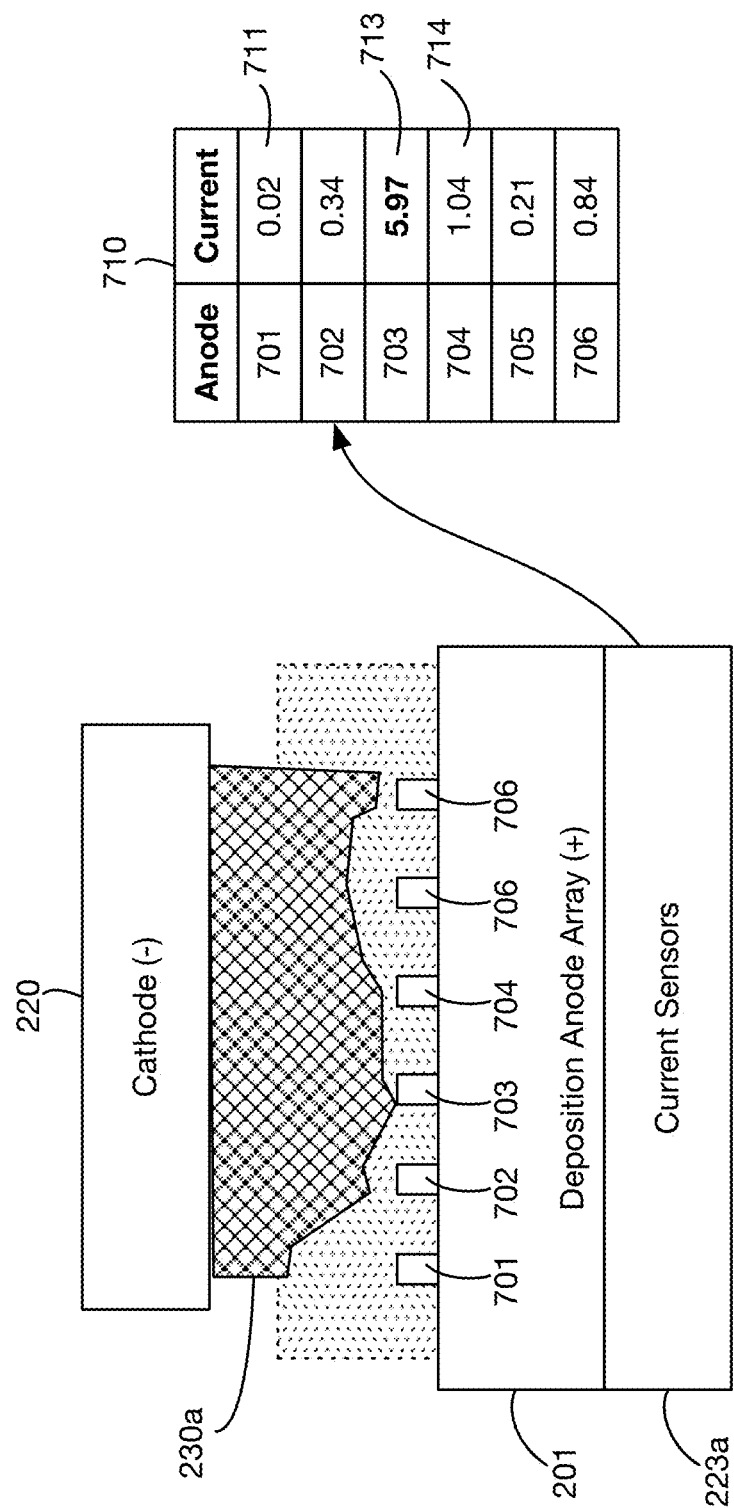
FIG. 7 shows an illustrative embodiment of feedback using current sensors across the anode array.

FIGS. 7 through 10 show illustrative feedback signals and analysis of these feedback signals to determine whether a layer is complete or to modify process parameters for layer manufacturing. FIG. 7 shows an illustrative method of feedback based on current sensors 223a that may for example be connected to the anodes of the deposition anode array 201. Current sensors may be used to estimate the extent of deposition proximal to each anode in the anode array, since the impedance between an anode and the cathode may vary based on the proximity of the anode to the deposited conductive material on the cathode. For example, anodes may be set to a known voltage, and the current flowing from each anode may then be inversely proportional to this impedance. FIG. 7 shows illustrative anodes 701 through 706, and an illustrative part 230*a* that has been partially constructed. Current sensors 223*a* measure currents 710 through each anode. For anode 703, the anode has formed a short-circuit with the deposited material; thus the measured current 713 is very high. For anode 704, the anode is very close to the deposited material, but is not quite short-circuited, so the measured current 714 is below the level 713 of the short-circuited anode 703. Anode 701 is far from the deposited material, so the measured current 711 is very small.

Figure 8:
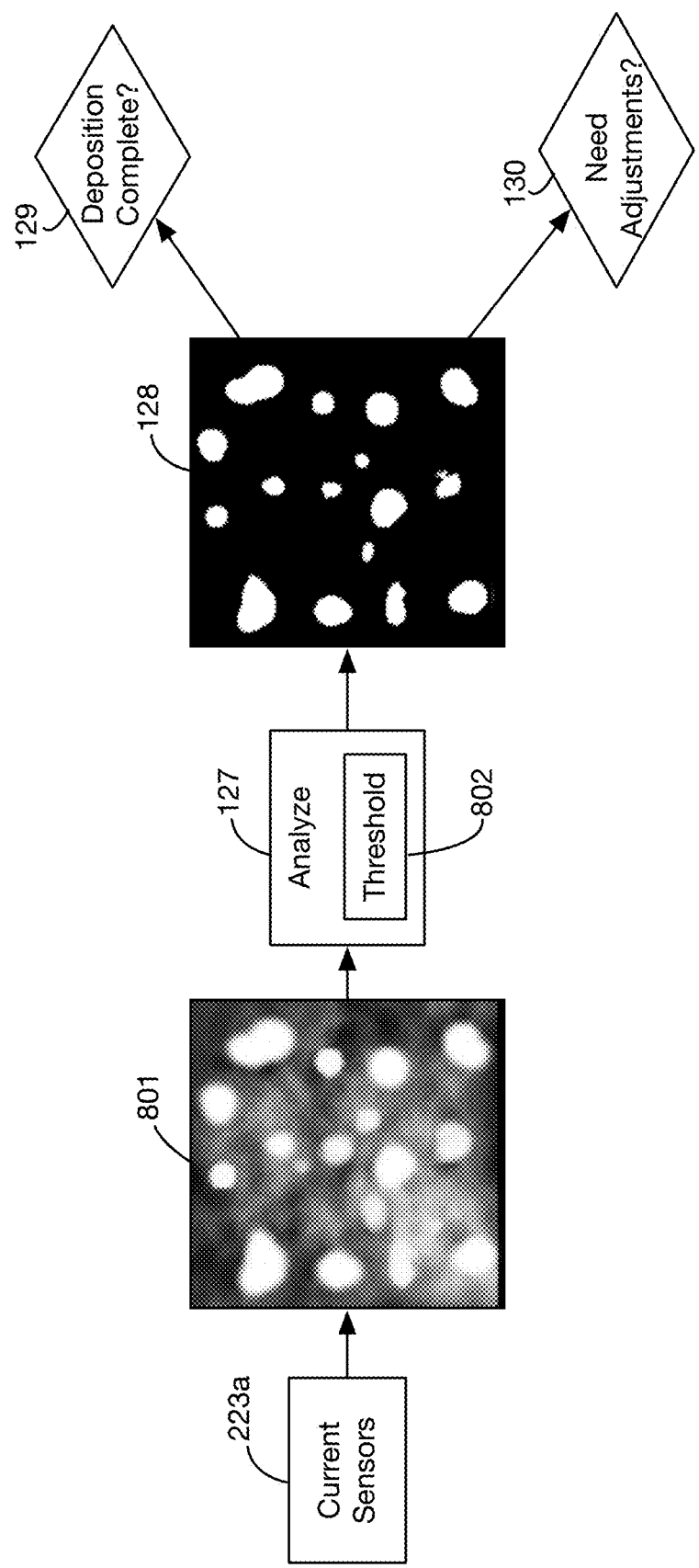
FIG. 8 shows an illustrative map of current sensor feedback signals, and processing of these signals to form a map of deposition areas within a layer.
Figure 9B:
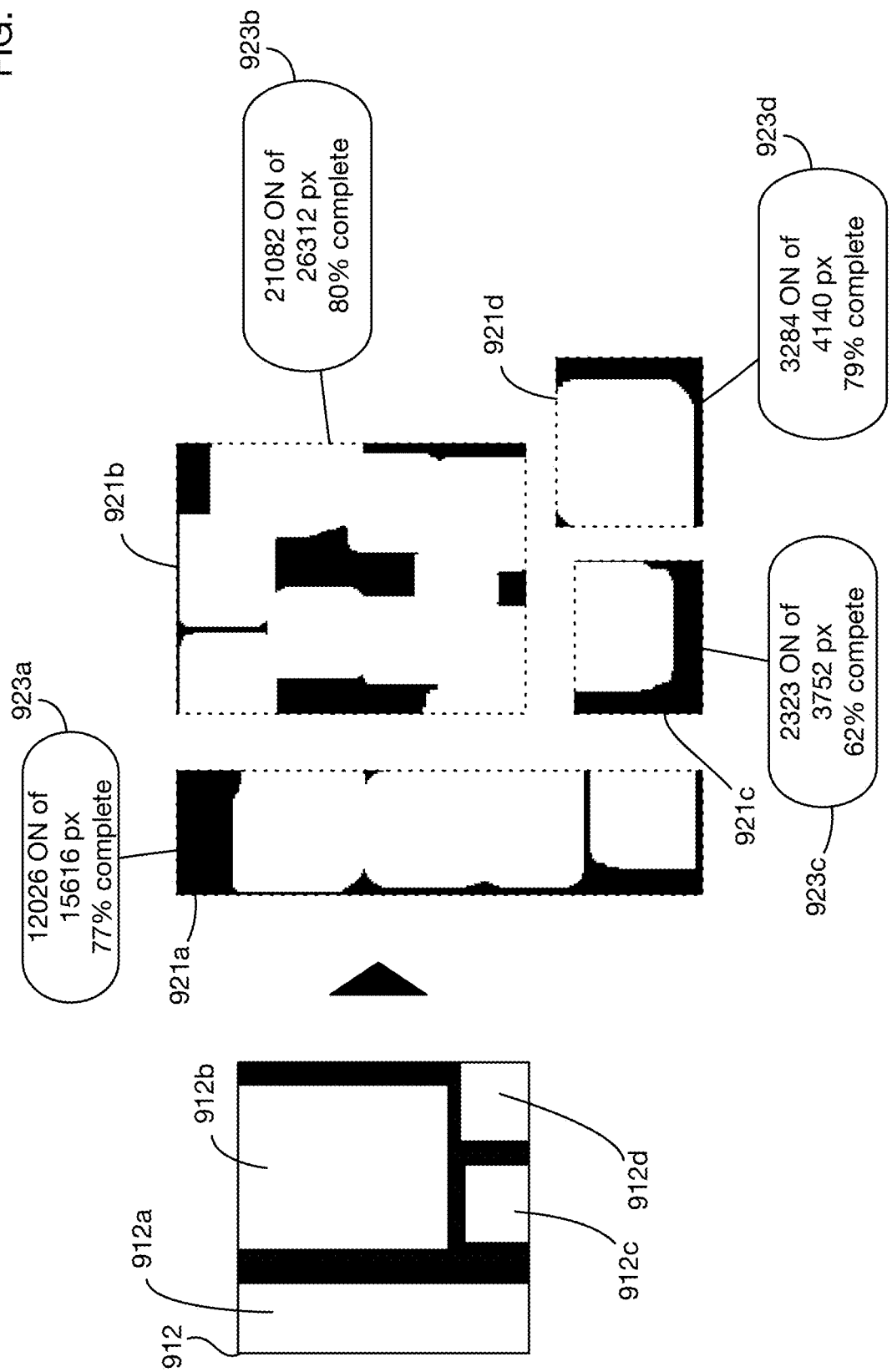
FIG. 9B shows an extension of the layer completion test of FIG. 9A, which tests separately for completion of all connected components of the layer.

In one or more embodiments, the feedback signals such as current sensor data 710 may be processed further to generate an analysis of the extent of deposition at locations within the part. This processing may for example be based on known or estimated relationships between the extent of deposition and the feedback signals. FIG. 8 shows an illustrative analysis of a two-dimensional map 801 of current measured by current sensors 223*a*. In this map 801, brighter pixels correspond to higher measured current. Analysis 127 of the current map 801 may for example apply a thresholding operation 802 to select pixels that exceed a specified current level, resulting in preliminary deposition analysis 128. This illustrative deposition analysis 128 is a binary image, with white pixels showing regions of high deposition and black pixels showing regions of lower deposition. Thresholding operation 802 is illustrative; one or more embodiments may analyze feedback signals 801 in any desired manner to generate a deposition analysis. The deposition analysis 128 may then be used to make determination 129 of whether deposition of a layer is complete, and determination 130 of whether modifications to any process parameters are needed for continued construction of a layer. FIGS. 9A and 9B show an illustrative analysis 129 to determine layer completeness, and FIG. 10 shows an illustrative analysis 130 of how to modify process parameters.

FIG. 9A shows an illustrative process to compare deposition analysis 128 to a layer target map 900 to determine whether manufacturing of the layer is complete. The target map 900 indicates where material should be deposited in the layer, with black pixels corresponding to material and white pixels corresponding to no material. The deposition analysis 128 shows areas of high current, which may for example indicate areas of short circuits where the anode and deposited material are in contact or are very close. In one or more embodiments, the deposition analysis 128 may be further processed to form an estimate of where material has been deposited in the layer. For example, image 128 may be modified using any transformations including for example, without limitation, morphological filters, linear or nonlinear filters, or Boolean operations. Illustrative operation 901 shown in FIG. 9A is a dilation operation (which is a morphological filter); this operation expands regions of white pixels by adding pixels out from the region boundaries. The resulting modified map 911 may provide an improved indicator of where deposition has occurred, since for example locations close to short-circuited anodes may also have high levels of deposition. This modified map 911 may then be compared to the target map to determine the extent to which the estimated deposition matches the desired deposition for the layer. First the target map 900 may be inverted in operation 902, so that in both the resulting inverted target map 912 and the modified deposition analysis 911 the white pixels correspond to deposition locations. A count 913 of the white ("on") pixels in inverted target map 912 indicates how many positions in the layer should receive deposited material. The modified deposition map 911 and the inverted target map 912 may then be ANDed in operation 920; the resulting map 921 shows the pixels that correspond to positions that should have deposited material (according to the target map) and that do have deposited material (according to the deposition analysis). The count 922 of white ("on") pixels in 921 may then be compared to the count 913 of desired "on" pixels; the ratio of these values 923 is a percentage of completion measure for the layer. In one or more embodiments, this completion percentage ratio may be compared to a threshold, and the layer may be considered complete when the threshold percentage is reached or exceeded. The operations 901, 902, and 920 shown in FIG. 9A are illustrative; one or more embodiments may apply any transformations or operations to the deposition analysis 128 or the target map 900 to determine whether a layer is complete, including but not limited to morphological operations such as 901 or Boolean operations such as 902 and 920.

One potential limitation of the method illustrated in FIG. 9A is that it is possible for the overall completion percentage for a layer to be high, while completion may be low for specific subregions of the layer. In some situations it may be important that subregions of the layer all be completed to a high percentage. FIG. 9B shows an illustrative extension of the method of 9A that applies a completion threshold to subregions. In one or more embodiments, subregions may be defined in any desired manner. For example, a layer may be divided into a regular grid of tiles of any resolution, and completion criteria may be applied to each tile. FIG. 9B illustrates an approach that divides the target map into "islands" of connected components, and that applies completion criteria separately to each island. Target map 912 (inverted as in FIG. 9A so that white pixels correspond to desired deposition) has four islands 912*a* through 912*d*; each island is a connected component and different islands are not connected. The modified deposition analysis map 911 is partitioned into these island regions, resulting in four deposition analyses 921*a* through 921*d*, corresponding to the islands 912*a* through 912*d*. Within each of these island deposition analyses, the percentage of white ("on") pixels indicates the level of completion of deposition within the associated island. These individual island completion percentages 923*a* through 923*d* may then be analyzed to determine whether the layer is complete. For example, a threshold may be applied to each of the island completion percentages, and the layer may be complete only when all of the islands meet or exceed this threshold. In one or more embodiments, different completion criteria may be applied to different islands, and the overall layer may be complete only when each island meets its respective completion criterion.

In one or more embodiments, completion criteria for a layer or for individual islands may be based on other factors instead of or in addition to a percentage of completion of desired deposited pixels. For example, a layer or an island may be considered complete if all or a certain number or fraction of pixels within the layer or island where deposition is desired are within a specified threshold distance of one or more deposited pixels. The set of pixels where deposition is desired, and the set of pixels where deposition has occurred (to a desired level of completion) may be determined as described above. In some embodiments, elapsed time of deposition, charge used for deposition, overall current, and/or impedance between the electrodes may be used as part of the determination whether a layer is done.

FIG. 10 shows an illustrative example of how the deposition analysis 128 may be used to adjust process parameters during the construction of the associated layer until the layer is determined to be complete. As for completion analysis, the deposition analysis 128 may first be transformed using any type of filters or operations. FIG. 10 shows an erosion operation 1001 applied to the deposition analysis 128 to generate a modified deposition analysis 1002. This erosion operation 1001, which is an example of a morphological filter, shrinks regions of white pixels by removing pixels from region boundaries. The resulting map 1002 therefore may represent a more conservative estimate of where deposition has occurred. The erosion operation 1001 is illustrative; one or more embodiments may apply any type of transformation to deposition analysis 128, including for example, without limitation, morphological filters, linear or nonlinear filters, or Boolean operations. Modified map 1002 may then be inverted in operation 1003 to yield map 1004, where the black pixels correspond to the eroded regions of deposition, and the white pixels correspond to locations with potential lack of sufficient deposition. This map 1004 may then be ANDed with the inverted target map 912, yielding a map 1006 that may be used to modify the process parameters for further construction of the layer. In this map 1006, white ("on") pixels correspond to locations where deposition is desired but may not yet be sufficiently complete. This map may therefore be used to set the outputs 1007 of the anodes in the anode array, so that deposition continues for anodes that correspond to the "on" pixels of map 1006. Anode outputs may be set for example by setting anode currents 1011, by setting anode voltages 1012, or by setting anode duty cycles 1013, or by using a combination of these methods.

FIG. 10 illustrates feedback control that generates essentially binary control signals for anodes, such as map 1006. Anodes may then be turned on or off based on these control signals. In one or more embodiments, anode control (or control of any other process parameters) may use non-binary control signals; for example, anode currents may be varied continuously from zero to a maximum value based on analysis of the feedback signals.

Although use of high resolution anode arrays may provide fine control of deposited material, in some situations the pattern of deposition of material onto the cathode may not correspond precisely to the pattern of anode outputs. One or more embodiments may therefore adjust the anode outputs by pre-processing the target map to account for these effects. FIGS. 11A, 11B, 11C, and 12A illustrate this process using a one-dimensional model of anode arrays for ease of presentation. Similar concepts may be applied in one or more embodiments to two-dimensional anode arrays; an example in two dimensions is shown in FIG. 12B.

Figure 11A:
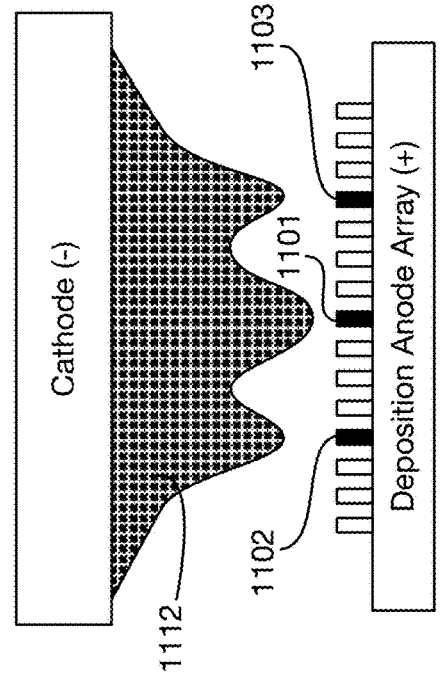
FIGS. 11A, 11B, and 11C illustrate a potentially complex relationship between anode currents and deposited material, which may require pre-processing to obtain the desired deposition pattern.
Figure 11B:
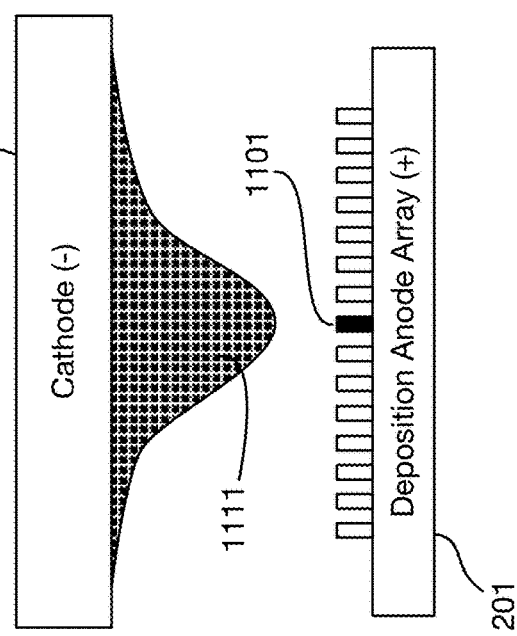
Figure 12A:
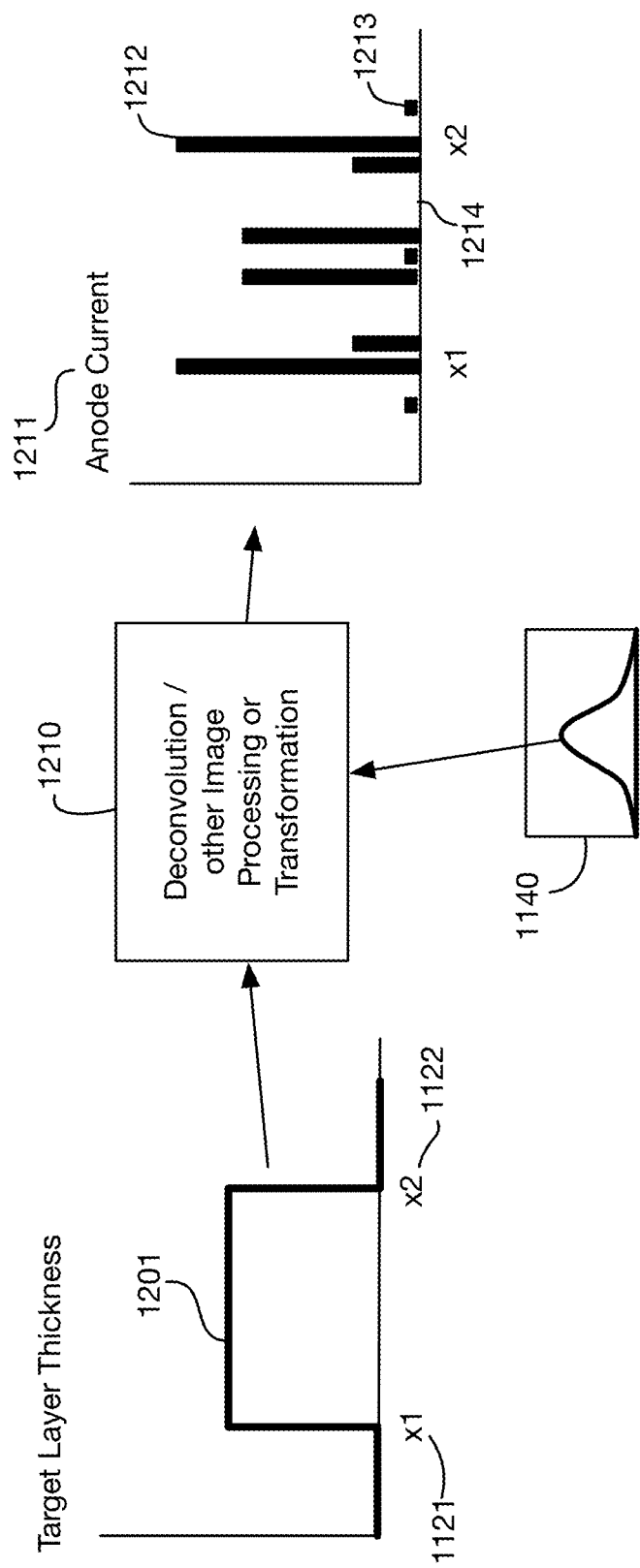
FIG. 12A illustrates calculation of anode currents to obtain a desired deposition pattern.

FIG. 11A shows illustrative deposition 1111 onto cathode 220 when only a single anode 1101 of anode array 201 is energized. In some environments, material may be deposited onto the cathode at positions that are not directly across from the energized anode. For example, deposition 1111 may occur in an approximately Gaussian pattern that is centered across from an energized anode, and that spreads out laterally from this center. FIG. 11B shows an illustrative deposition pattern 1112 when multiple anodes 1101, 1102, and 1103 are energized. In this scenario, the deposition pattern may be approximately the sum of the deposition patterns from each of the individual anodes 1101, 1102, and 1103. In particular, FIG. 11B illustrates that deposition may be higher at the center (across from anode 1101) than at the edges, due to the additive effects from all three of the anodes.

Figure 11C:
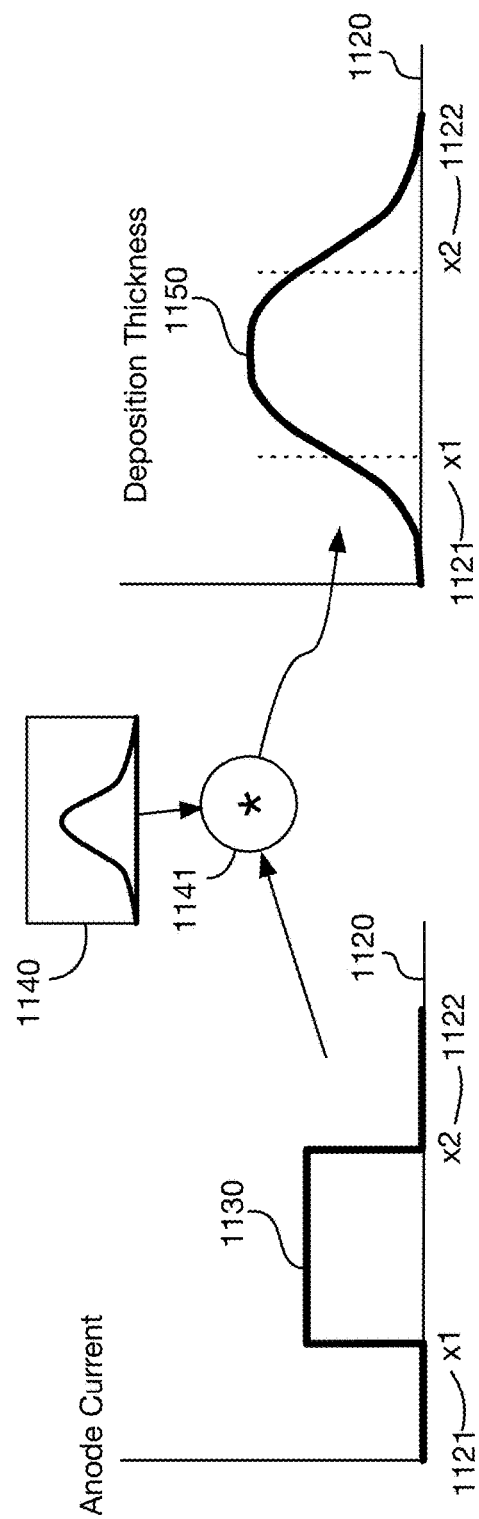

If deposition patterns from individual anodes combine additively, the general effect of the phenomena shown in FIGS. 11A and 11B may be to modify the pattern of anode outputs via a convolution 1141 with a point spread function 1140 that describes the spread of deposition from a single anode point source. FIG. 11C shows an illustrative pattern 1130 of anode current that is constant within a range from 1121 to 1122, and zero outside this range. Because of convolution 1141, the actual deposition thickness will not match the input shape 1130, but instead will have shape 1150 with higher accumulation in the center, and with some deposition extending beyond the bounds 1121 and 1122. Effectively the sharp corners of the anode current pattern 1130 are smoothed by the effects shown in FIGS. 11A and 11B. One or more embodiments may therefore modify the anode currents to account for this convolution 1141 or for other effects that distort the deposition pattern. FIG. 12A shows an illustrative approach that may be used in one or more embodiments. Based on a target map 1201 that describes the target thickness of a layer as a function of position, the build planning process may perform a deconvolution 1210 or other transformation to reverse the effects of the distortion illustrated in FIGS. 11A through 11C. For example, target map 1201 with a constant thickness between bounds 1121 and 1122 may be deconvolved to an anode current pattern 1211. To compensate for the dispersive effects of the deposition point spread function, the illustrative anode current has a higher value 1212 at the edges, and some anodes such as 1214 within the central region of the rectangular pattern may be turned off entirely. In addition, some anodes such as anode 1213 may have nonzero currents even if they are outside the bounds 1121 and 1122. These effects are illustrative; one or more embodiments may generate any desired anode current pattern 1211 to achieve the desired layer thickness pattern 1201. Transformations 1210 may include any deconvolution methods or any other function transformation or image processing methods. These transformations may be based on any measurements or models of the deposition process, including for example a point spread function 1140 that describes how anode currents are mapped to deposition patterns.

FIG. 12B shows a two-dimensional example of transformation of a target map into a desired anode current pattern. Target map 1220 shows areas of desired deposition (in black) for a particular layer of a part build. As described above, transformations 1210, which may for example include deconvolution or any other type of image processing, may be applied to this target map 1220 to generate a pattern 1230 that indicates the anode current pattern that may be generated to achieve the desired deposition. In this example, anodes are turned on for the anodes that correspond to anodes with desired deposition, and additional anodes (shown as cross-hatched regions) are turned on around the edges and the corners of the deposition area. For example, edge anodes are turned on around each outer edge, such as anodes 1231 along the top edge, and additional anodes are turned on around the corners, such as anodes 1232 around the top right corner. Turning on these additional edge and corner anodes helps to shape the field of current to drive deposition of material more evenly at the corresponding edges and corners of target map 1220.

One or more embodiments may also modify anode currents over time in a preprogrammed or adaptive pattern, as illustrated in FIG. 13. For example, in one or more embodiments, subsets of anodes may be successively switched on and off during the manufacturing of a layer. This alternation may for example compensate for potential depletion of metal ions in the electrolyte that might occur if anodes output a constant current throughout the construction of a layer. It may also prevent formation of bubbles in the electrolyte. In the example shown in FIG. 13, target map 112e has a square central area 1301 where material is to be deposited. Instead of constantly emitting current from all of the anodes that correspond to this region 1301, one or more embodiments may alternate current from two subregions 1311 and 1312, which partition the region 1301 into a checkerboard pattern. During phase 1321, anodes in region 1311 emit current 1331, and anodes in region 1312 are switched off; during phase 1322, anodes in region 1311 are switched off, and anodes in region 1312 emit current 1332. This alternation may for example allow ions 1310 in the electrolyte to diffuse into the regions adjacent to the switched-off anodes so that these regions are not depleted. The checkerboard pattern of regions 1311 and 1312 is illustrative; one or more embodiments may divide anodes into any number of regions of any shape and size, and may switch anodes of these regions on and off in any desired pattern with any desired duty cycles.

Figure 14:
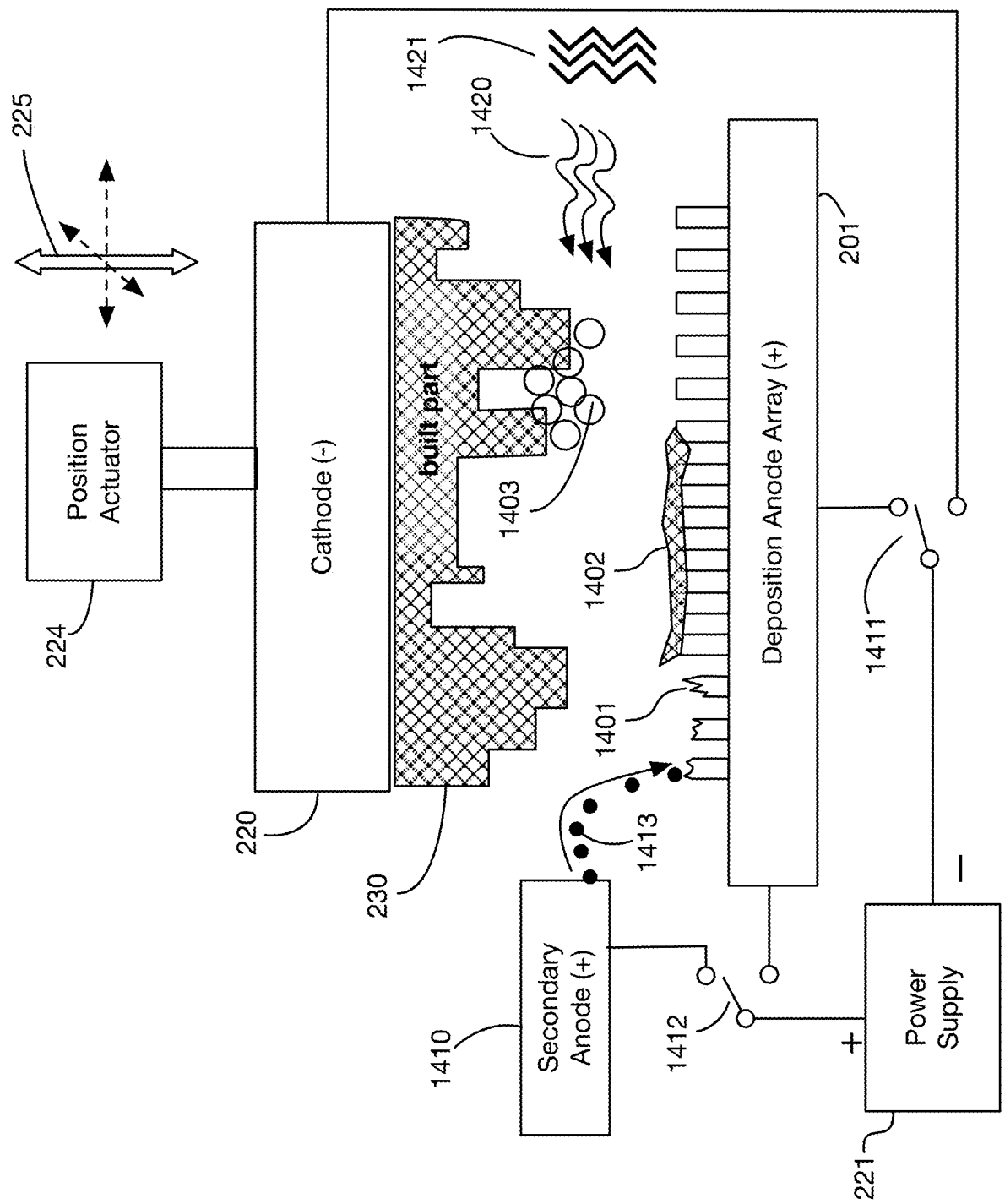
FIG. 14 shows illustrative maintenance actions that may be performed during layer manufacturing to address issues in the anode array or the electrolyte.

FIG. 14 shows illustrative maintenance actions that may be performed during the manufacturing process in one or more embodiments. These actions may for example be interleaved with deposition, or they may be performed between manufacturing of layers. The actions shown are illustrative; one or more embodiments may perform any desired maintenance activities at any point in the manufacturing process. FIG. 14 shows three illustrative issues that may arise during manufacturing that may require maintenance activities. First, anodes in the anode array 201 may erode, such as anode 1401, and may need to be replenished or resurfaced. Second, films such as film 1402 may form over anodes and prevent them from effectively driving deposition onto the cathode. Third, bubbles such as 1403 may form in the electrolyte between the anode array and the deposited material 230.

Over time, anodes such as anode 1401 may erode, even if anodes are constructed of a largely insoluble material. One or more embodiments may periodically or as-needed reverse this erosion using a secondary anode 1410. The deposition process may for example be paused and the power supply 221 may be reversed using switches 1411 and 1412, so that the anode array temporarily acts as a cathode, and the secondary anode 1410 acts as the anode. Current flowing from the secondary anode 1410 may then cause material 1413 to flow from the secondary anode to the eroded anodes in array 201. The secondary anode 1410 may for example be a large bulk anode that is composed of an inert material like platinum. The secondary anode may be composed of the metal that is used for electrodeposition, such as copper for example; this metal will dissolve and plate onto the anodes of anode array 201 without depleting the metal in the electrolyte solution. When the switches 1411 and 1412 are reversed again, the metal plated onto the anode array then plates onto the cathode.

In some cases, target deposition material (such as copper from a copper electrolyte bath) may end up plated onto a surface of the electrode array as a film 1402. This film of target material may bridge between multiple deposition electrodes and may impact their ability to be individually addressed. A film may be detected from the feedback signals, for example when a group of adjacent anodes shows an abnormally high current. A film may be removed for example by moving cathode 220 far away from the anode array and activating the anodes covered by the film. This action dissolves the film while not causing an unintended deposit on the cathode.

During electrolysis, bubbles 1403 may form in the space between the anode array 201 and the part 230. Bubbles may be removed for example by manipulating or modifying the flow 1420 of electrolyte, for example with pumps or agitators, or by inducing vibrations 1421 in the electrolyte to dissipate the bubbles. Vibrations may be introduced into the electrolyte using a vibration oscillator in contact with the electrolyte, or by vibrating the cathode, anode array, or reaction chamber. Flow manipulation may also include purposefully increasing the distance between the build and the anode array to allow for greater fluid flow and/or bubble removal, while either keeping the anodes energized or de-energized until the flow manipulation is complete.

In one or more embodiments, all or portions of the feedback signals, control parameters, and deposition analyses measured or generated throughout a build of a part may be maintained as quality control records. This data may be used for any or all of several purposes, including for example facilitating or eliminating part inspections, supporting certification of parts or manufacturing processes, and post-mortem analysis of part failures or part performance issues. In addition to providing detailed tracing for the specific manufacturing steps and parameters used for each part, this quality control data may be aggregated across parts, lots, or facilities and used for statistical process control and for continuous process improvement. For example, data on part performance in the field (such as failure rates or part lifetimes) may be correlated with the part quality control data to discover correlations between process parameters and part performance; these correlations may then be used to improve future part build processes. In one or more embodiments, machine learning techniques or other artificial intelligence techniques may be used to automatically discover relationships between build record information and part performance. For example, analysis of large numbers of parts and their associated quality control records may show that a lower current density for particular types of layers results in higher part failures; a manufacturer may use this type of information to modify build processes to reduce future failure rates. When relationships between build parameters and part performance are discovered, the database of build quality information for parts may be used to predict failures for previously built parts, allowing them to be potentially recalled or replaced prior to failure.

Figure 15:
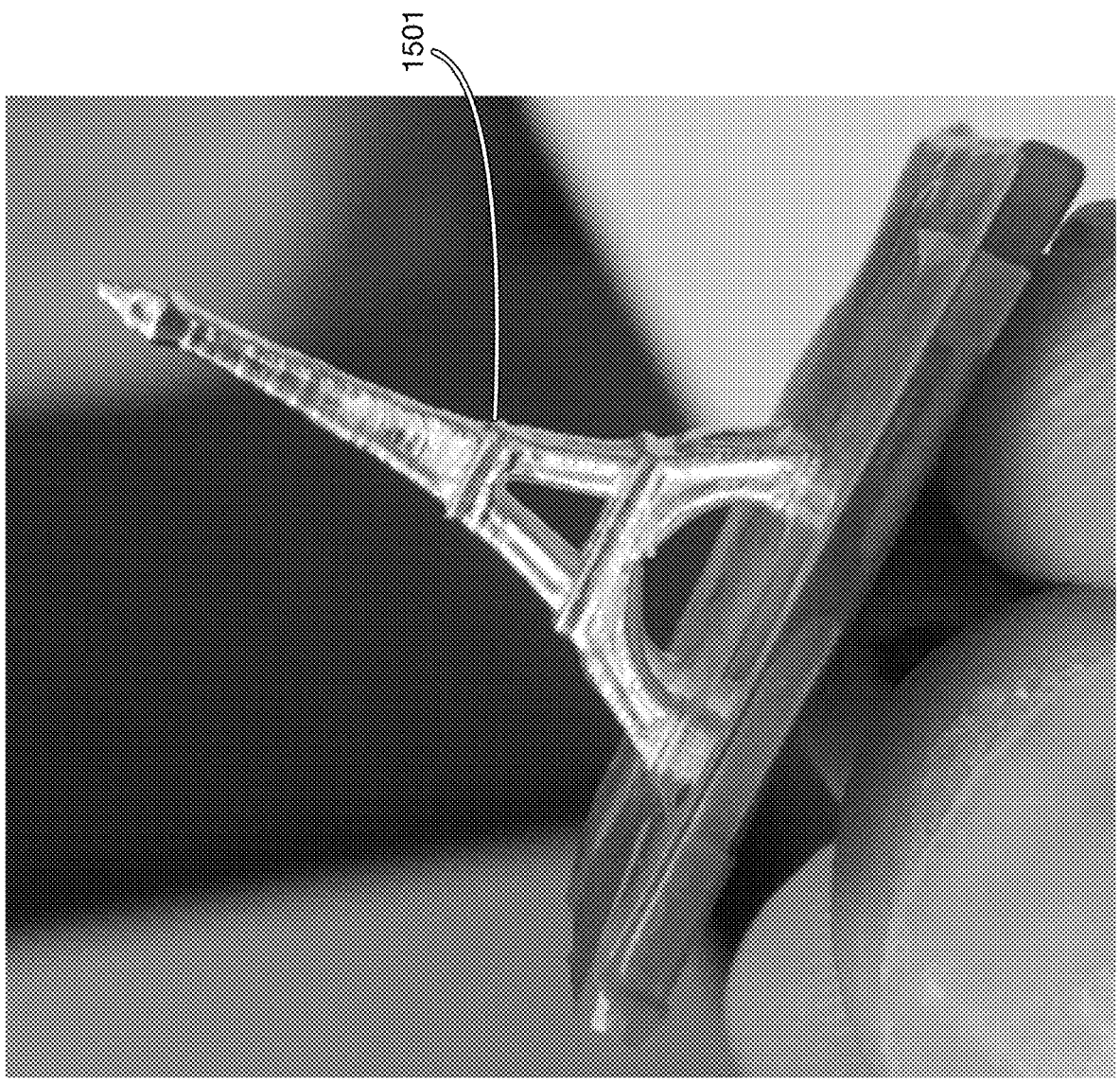
FIG. 15 shows an illustrative part manufactured using an embodiment of the invention.

FIG. 15 shows an illustrative part 1501 that was manufactured using an embodiment of the invention. Feedback control of the manufacturing process using techniques described above enables the extremely fine resolution and high quality of this completed part.

In one or more embodiments, a manufacturing process such as the processes described above may enable addition of interconnection features, heatsinks, or similar structures to a plate, such as a silicon wafer, for example. Interconnection structures may be referred to for example as "wafer bumps", or "pillars." Precisely formed, electrically conductive interconnection structures are a critical component in semiconductor and electronics packaging. Increased technological demands are driving an increase in interconnect density per area, or packing in a greater number of thinner, taller features with smaller distance between them. Electrochemical additive manufacturing offers the potential of constructing more effective interconnection structures compared to processes currently known in the art.

A typical wafer bumping fabrication process is relatively complex and involves multiple steps—first is the deposition of a conductive, often metallic film, as a "seed" layer, second is the application, exposure and development of a photoresist to define the locations in which bumps are desired, then an electrodeposition step to deposit the material into the openings defined by the photoresist. Finally, the photoresist and seed layers are removed leaving independent electrically isolated structures on the substrate.

Further, since the photoresist defines the regions and sidewalls of the deposited bump material, the primary limitation in bump geometry and spacing is driven by the capabilities of the photoresist, including aspect ratio (vertical feature dimension vs. horizontal feature dimension) that the photoresist is capable of resolving, minimum diameter, maximum overall height, and spacing between adjacent bumps. Another issue with photoresist based processing is the requirement to create a new mask whenever a new connection pattern is desired. Thus, a wafer bumping process that reduces or eliminates the reliance on photoresist sub-processes is desired not only from a manufacturing cost and time efficiency perspective, but also to enable higher performance interconnect structures.

Figure 16:
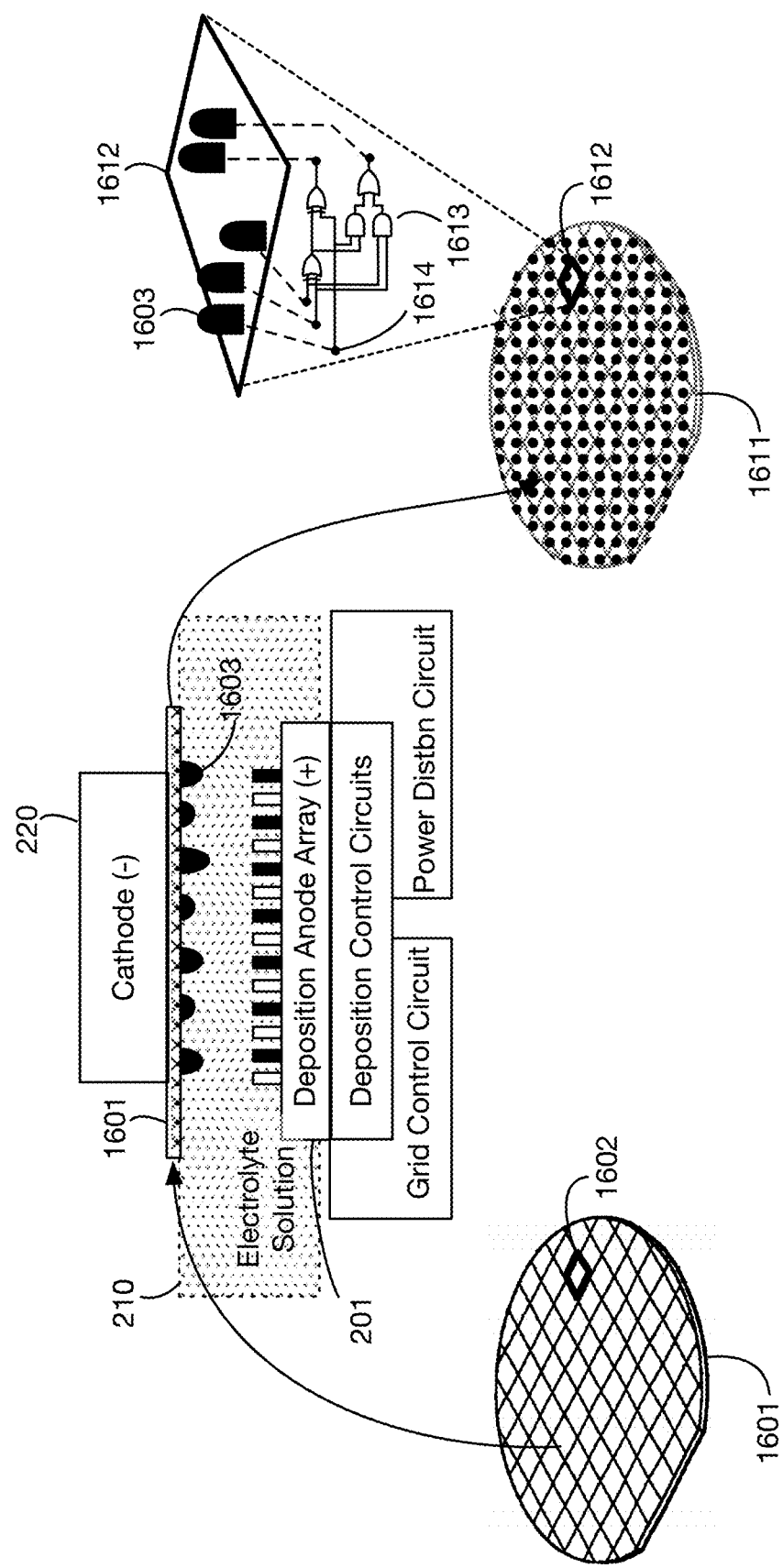
FIG. 16 shows an illustrative application of an embodiment of the invention, which adds wafer bumps to a wafer by depositing the bumps using electrochemical additive manufacturing.

FIG. 16 illustrates addition of wafer bumps using electrochemical additive manufacturing, which may provide benefits such as those described above. An objective is to add wafer bumps or similar structures to a plate 1601, which may be for example a silicon wafer or any type of substrate onto which circuits or components are placed. Plate 1601 may be of any size or shape, and it may be made of any materials. It may contain one or more tiles such as illustrative tile 1602; each tile may for example contain a circuit or circuits, or isolated electronic or electrical components. Typically it is desired to add conductive structures to one or more surfaces of the plate. These structures may be for example electrically conductive, thermally conductive, or both. They may serve, for example, as interconnections to other circuits or devices, they may serve as heat sinks to remove heat from circuits on plate 1601, or they may perform mechanical functions such as alignment or attachment. To construct these structures, plate 1601 may be connected to cathode 220 in an apparatus similar to the apparatus described with respect to FIG. 2. Current flows from anodes in deposition anode array 201 through electrolyte solution 210 that is in contact with the surface of the plate, resulting in deposition of interconnect structures such as bump 1603. The amount of current flowing from each anode is controlled in order to deposit material for the connection structures in a precise pattern. The completed plate 1611 may have multiple interconnect structures throughout the plate. Illustrative completed tile 1612 within plate 1611 has five wafer bumps, each connected to a corresponding connection point in a circuit 1613 that is within or proximal to the tile; for example, bump 1603 is connected to connection point 1614 of circuit 1613.

Figure 17:
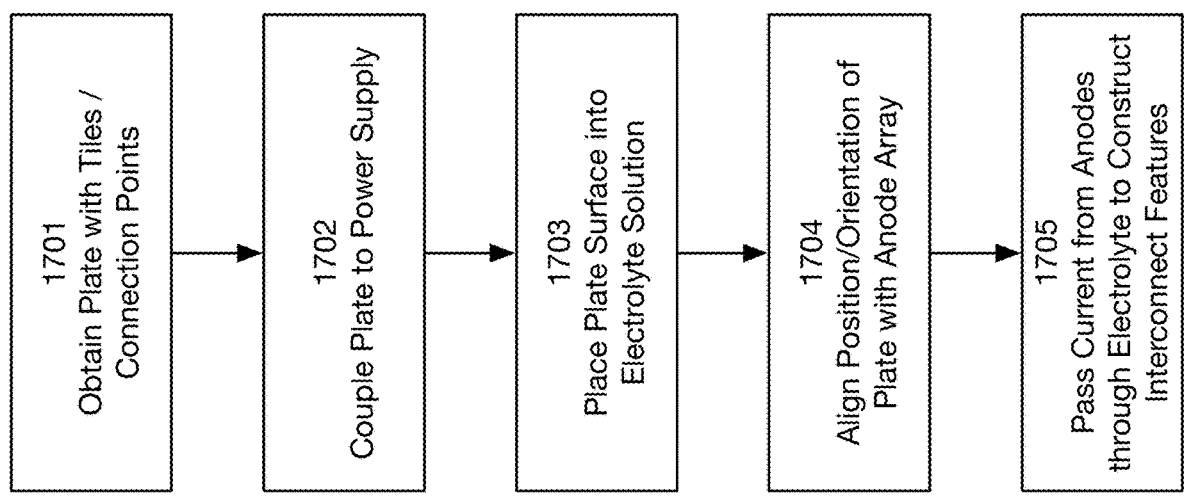
FIG. 17 shows an illustrative flowchart of a method for adding wafer bumps or similar features to a plate using electrochemical additive manufacturing.

FIG. 17 shows a flowchart of illustrative steps that may be used in one or more embodiments to fabricate interconnection structures or similar features on a plate. In step 1701, a plate is obtained; the plate may contain one or more tiles, each of which may contain one or more connection points. The plate may have a conductive seed layer, which may for example be deposited onto a surface of the plate. In step 1702, the plate is coupled to a power supply (for example via attachment to a cathode as in FIG. 16); for example, this attachment may create an electrical connection to the conductive seed layer of the plate. In step 1703 a surface of the plate, such as a surface of the seed layer, is placed into contact with an electrolyte solution. In step 1704, the plate is aligned precisely with the anode array; this alignment may set the relative position and orientation of the plate and anode array by repositioning one or both of them. In step 1705, current is passed from anodes in the anode array through the electrolyte to construct the interconnection features.

Step 1705 may construct the features layer by layer, as described above. Layers may be of any height. The inventors have discovered that shorter layer heights may lead to better deposit quality, and may require lower plating voltages and current densities. Illustrative layer heights used in one or more embodiments of the invention are 5 microns or below; one or more embodiments may use layer heights of below 1 micron for improved control and deposit quality. In some situations it may be advantageous to have a higher than normal current density or anode voltage, and/or a shorter than normal layer height on the initial layers to assist with forming the initial deposit localization. In some cases it may be advantageous for the final (top) layers of a deposit to have different parameters from the rest of the print for the purposes of guaranteeing a higher quality surface finish for the sides and top of the deposit. This can be achieved for example by increasing the working distance to a greater distance than used in the rest of the build and reducing the current. For instance, if a working distance of 10 microns per layer is used for the majority of a build, an increase to 25 microns or more could be used. This blankets the deposit in a less localized, high quality layer of material.

During step 1705, feedback control techniques including those described above may be used to control the manufacturing process. Illustrative feedback control methods may include for example measuring the current through each anode. Current may be measured by turning on one anode at a time and measuring the current through the entire anode array. Alternatively in one or more embodiments a voltage sensing analog to digital converter may be connected to each anode's surface. When this voltage drops, it indicates that the deposit has gotten close to or touches the anode and the anode is now grounded. By knowing the resistance of the pixel, the voltage drop at the anode (surface voltage less supply voltage) can be divided by the anode's resistance to calculate an anode current. This technique has the benefit of providing current mapping data without stopping the deposition process, as well as providing the actual anode currents during deposition—thus revealing for example a solution depletion effect that would not be visible if only sensing one anode at a time.

Based on the feedback signals (such as current or voltage measurements), the system may modify the flow of current through individual anodes. Anodes may be turned on or off (binary control), or the amount of current through anodes may be varied (continuous control). To turn an anode off, it may switched to a high-impedance mode (not ground) to stop the flow of current through the electrode. Alternatively, in one or more embodiments, anodes may be turned off by setting the anode to a prescribed voltage rather than a high impedance state. This voltage may be selected specifically to be greater than 0V or ground potential, but lower than the voltage at which current flows through the anode. Generally an electrochemical system is defined by the combination of anode material, bath makeup and electrode geometry (size/spacing) and results in a nonlinear relationship between anode voltage and system current. For each electrode and bath combination this relationship can be characterized to understand the voltage at which an electrode potential can be maintained without appreciable current being passed or material being deposited. More specifically, this voltage may be higher for Platinum than for Copper when used as an anode. When a platinum electrode is found to have a copper film the electrode can be set to the copper threshold voltage; the copper will pass current and dissolve into solution but once all the copper is removed the potential will not be at a high enough potential to pass significant current through the system. Anode or system current can be measured to characterize when Cu film removal is complete. In some cases, it might be desired to leave an anode energized for a period of time even after a short has been detected on that anode. This method may impact the condition of the top surface of the deposit and the diameter of the feature as it grows.

Continuous variation in anode current may be useful because different locations in the deposit may require lower or higher current densities. For instance, in an array of bumps with all anodes addressed to an equal current density, those on the interior of the array build faster and thicker, with those on the edges resulting in less material and in the corners even less. This difference can be characterized and compensated for by addressing different voltages/current densities to anodes based on their position, size, or other measurements (even real time current measurements, for instance if ions are depleted at one location). In some embodiments, however, the anodes in the anode array may be controlled in groups or as one group. In these types of embodiments, each interconnection column may correspond to an anode of the anode array. In some embodiments, for a device that requires thousands of features to be deposited, the corresponding anode array may be fabricated with thousands of individually controlled anodes. This is distinguished from an application with multiple anodes when the number of anodes is much smaller than the number of features, such as those that may be used in some mask based systems.

In some embodiments, several anodes in the array may be energized to form a contiguous deposit, for instance a single square deposit of dimension 45 micron×45 micron could be equally achieved by activating a 3×3 grid of anodes on a uniform grid of 15 micron spacing. Alternatively, various sub-pixel geometries can be employed to help modulate the electric field and provide greater control over the growth of the deposit. For instance, central anode elements and external anode elements to compensate for variations in deposition uniformity of a deposit from the center to the external diameter.

Figure 22A:
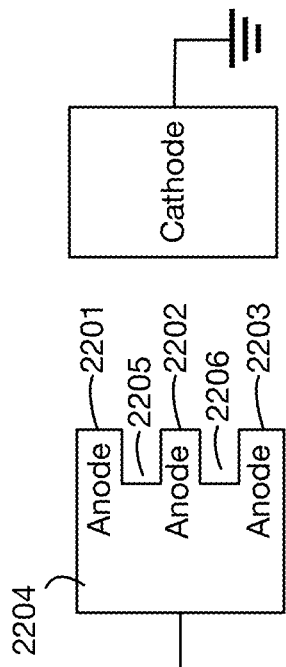
FIGS. 22A, 22B, and 22C illustrate different types of electrode configurations that may be used in one or more embodiments.
Figure 22B:
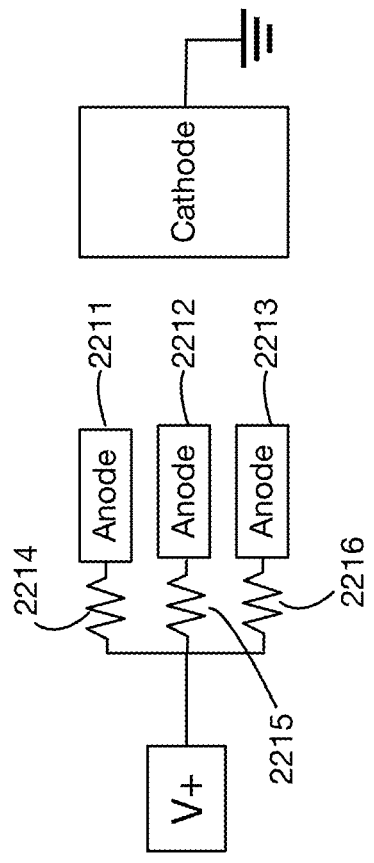
Figure 22C:
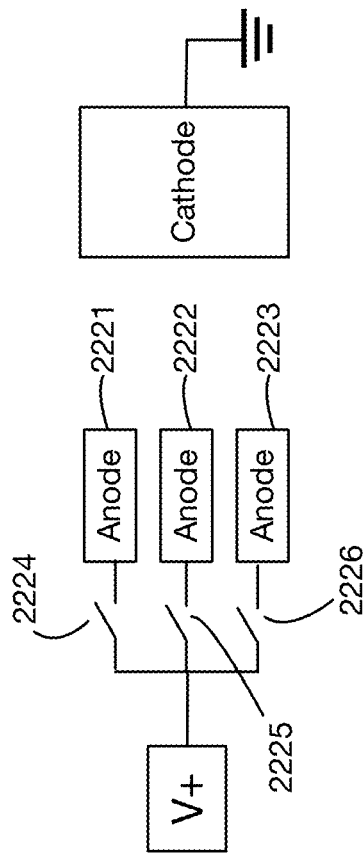

FIGS. 22A, 22B, and 22C illustrate three example types of electrode configurations: FIG. 22A illustrates non-independent electrodes, non-independently controlled; FIG. 22B illustrates independent electrodes, non-independently controlled; and FIG. 22C illustrates independent electrodes, independently controlled, which may be implemented using an anode array, for example.

FIG. 22A illustrates an embodiment in which the anodes are non-electrically independent and are also non-independently controlled. Three illustrative anodes, 2201, 2202, and 2203, may for example be fabricated by taking a conductor 2204 and simply masking openings 2205 and 2206 on its surface. When placed in proximity to the substrate, independent deposits will begin to form but since the electrodes are not electrically isolated, when the deposit grows enough to create a short contact between the anode and cathode, current preferentially flows through that deposit rather than through the solution to form the remaining deposits. This shorting effect may be mitigated by careful attention to the deposition current to detect impending contact followed by adjustment of the anode/cathode gap.

In the embodiment illustrated in FIG. 22B, illustrative anodes 2211, 2212, and 2213 are electrically independent, but not independently controlled. The electrodes may be electrically independent in that each is isolated from the other anodes with, for instance, a resistor. For example, anodes 2211, 2212, and 2213 are isolated via resistors 2214, 2215, and 2216, respectively. When a group of anodes is activated, their deposits will grow, and when one deposit grows to touch its respective anode, the isolating resistors serve to limit the short circuit current flowing through that anode, enabling current to flow through the remaining anodes and continue growing their respective deposits.

In the embodiment illustrated in FIG. 22C, each of the illustrative anodes 2221, 2222, and 2223 are individually and independently controlled, via corresponding switches 2224, 2225, and 2226, respectively. Note that while the switches are illustrated using knife blade symbols, the switches may be of multiple types and may provide independently controlled non-binary (analog) control signals to the anodes.

Figure 18:
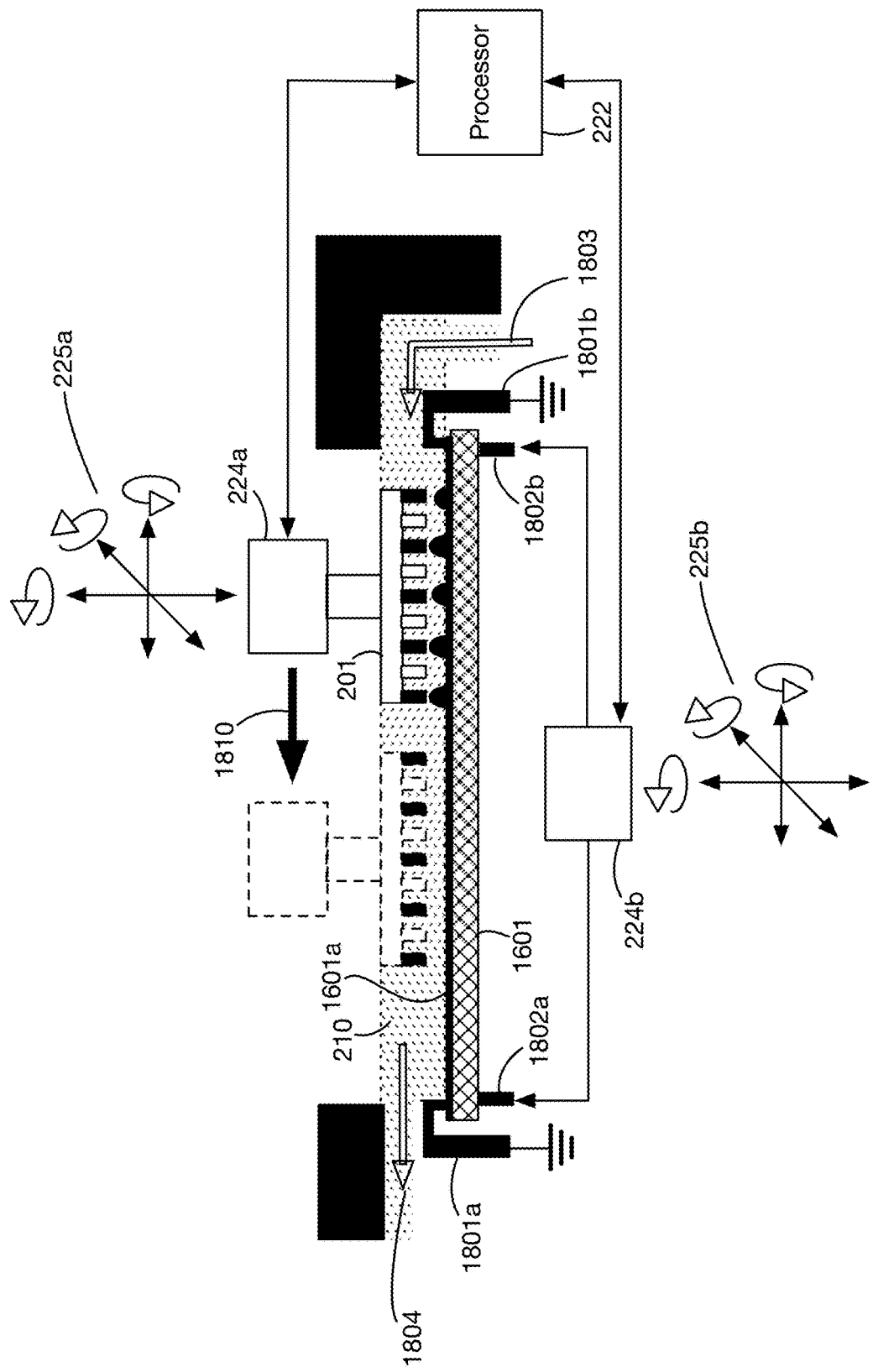
FIG. 18 shows illustrative equipment that may be used to implement the method shown in FIG. 17.

FIG. 18 shows a variation on the apparatus illustrated in FIG. 16, which may be used in one or more embodiments to construct interconnection features or other structures. In this illustrative apparatus, the anode array 201 is vertically above the plate 1601 and the cathode. The plate 1601 may be held in position using methods known to the art of semiconductor manufacturing. These may include mechanical clamping, vacuum chucks, and the like. In some cases, an electrical connection is made to the surface of the substrate. This electrical connection can be through the clamping assembly, or as a separate clip. The plate may have been previously coated with a conductive "seed" layer 1601a to which the electrical connection is made. In the example shown in FIG. 18, plate 1601 is held in position via clamps or chucks 1801a and 1802a, and 1801b and 1802b. Any number of clamping points may be used in one or more embodiments. Connectors 1801a and 1801b make electrical contact with conductive seed layer 1601a of plate 1601, coupling the seed layer to the ground of the power supply circuit so that it acts as the cathode for electrodeposition.

A mechanical positioning system may be used to set, modify, and maintain the relative position and orientation between the anode array 201 and the plate 1601. In some embodiments, it may be used to maintain a consistent gap between the deposited material's surface and the anode array as the deposit forms. It may also align the anode array relative to the plate to ensure that deposition of structures happens in the desired locations. The orientation of the anode array relative to the plate may be controlled to ensure that the anode array is substantially coplanar to the plate. The mechanical positioning system may also include sensors to determine the relative location between the anode array and the plate, including for example, without limitation linear potentiometers, Linear Variable Differential Transformers (LVDT), Hall effect, capacitive, Laser rangefinder, laser and other similar linear encoder types. Sensors may for example use optical or electrical methods of inspecting the plate position or orientation relative to the anode array. For example, in some embodiments a high magnification optical system may view the positions of alignment marks on both the anode array and the plate and determine their relative offset. In one or more embodiments a notch or flat section of the plate may be used to align the apparatus to the plate and to approximately locate the features on the plate. It is possible that in some embodiments that measurements may be taken using the anode array itself to determine the coplanarity of the anode and substrate. These measurements could include for example, a capacitance reading using the seed layer of the substrate, or voltage or current, or A/C impedance measurements between the anode and substrate either in air or the plating bath to determine the distance between the surfaces at various locations in the build volume. The coplanarity alignment of the anode array relative to the substrate is also important. This, for instance, can be done by incorporating multiple sensors to characterize the gap between the anode and cathode at various locations, for instance using a capacitive or laser sensor. Using the differences in these gap measurements the anode array or substrate (or both) can then be moved to bring the planes of each into alignment. Knowing that a typical substrate size could be a 300 mm wafer, and that the feature targeted to be manufactured is a pillar 30 microns in diameter and less than 100 microns tall, gap measurement and alignment accuracy of approximately one micron or less may be required for successful pre-deposition alignment.

To begin deposition of material onto the plate, one or more embodiments may use an initial zeroing process to place the anode array and the plate into the appropriate starting positions. For example, zeroing may be performed in one or more embodiments with a position sensor which senses the gap between the anode and cathode. The mechanical positioning system may be activated to move the anode array closer to the cathode; once the position sensor starts sensing less displacement than the commanded distance, the system determines that the plate and the anode array have begun to contact one another. This measurement can also be done optically, for instance with a laser, magnetic, or electrical sensor. Coplanarity of the anode array and the cathode is also extremely important for the quality and consistency of deposition. Similar zeroing techniques may be employed at multiple locations across the cathode plane to ensure coplanarity, with adjustment in the anode holder, cathode holder or both.

The mechanical positioning system may move the anode array, the plate, or both. In the illustrative apparatus shown in FIG. 18, actuators 224a may move the anode array 201, and actuators 224b may move the plate 1601. For example, actuators 224b may affect the positioning of the clamps 1801a/1802a and 1801b/1802b in order to modify the position or orientation of plate 1601. One or more embodiments may have only one of actuators 224a or 224b; one or more embodiments may have both. Motion of the anode array may have as many as six degrees of freedom 225a, to allow the anode array to be placed into any desired position and orientation. Similarly motion of the plate may have as many as six degrees of freedom 225b, to allow the plate to be placed into any desired position and orientation. The actuators 224a and 224b may be controlled by processor 222, which may obtain sensor data indicating the relative position and orientation of the anode array and the plate, and may control actuators 224a and 224b to set this relative position and orientation to desired values.

In one or more embodiments, the plate 1601 may have a horizontal extent that exceeds the size of anode array 201. In these situations, the anode array may be shifted horizontally relative to the plate to successively construct interconnection structures in different subregions of the plate. For example, in FIG. 18, a horizontal repositioning 1810 of anode array 201 may be performed after features are constructed for the tiles on the right side of the plate.

One or more embodiments may also include a fluid system to manage the flow of and condition of electrolyte solution 210. For example, in FIG. 18 the fluid system pumps fluid 1803 from the right side across the gap between the anode array and plate, and fluid exits at position 1804 for recirculation. The fluid system may have for example any or all of a pump, filter, temperature control system (temperature gauge, heater, chiller), tubing, analytical equipment such as pH and ion concentration sensors (conductivity, spectrophotometer, mass spectrometer, inductively coupled plasma mass spectrometry, others), a leaching system to absorb undesired byproducts, and replenishment system designed to add electrolyte bath components back to the bath as they are consumed. All of these system components may be designed to withstand the corrosive electrodeposition environment. Fluid flow or motion of the system components may also be used to prevent or reduce bubbles that may form during electrodeposition. A bubble clearing cycle may be initiated periodically or based on measurements that indicate reduced deposition efficiency, such as reductions in measured current overall or at individual anodes that indicate lack of a conductive path or bubbles insulating the anodes. One or more embodiments may use ultrasonication of the fluid to better flush bubbles, pulsing flow rather than constant fluid flow rate. For example, an ultrasonic transducer may be placed in contact with some combination of the fluid, anode, and cathode; it may injects ultrasonic energy into the solution which causes gas bubbles in the solution to release from their substrates and break into smaller bubbles, two aspects which make the bubbles easier to remove from the active build area along with the flowing solution. One or more embodiments may also vibrate the entire assembly to clear bubbles.

The fluid flows 1803 and 1804 shown in FIG. 18 are parallel to the planes of the plate and the anode array. In one or more embodiments, fluid flow may be perpendicular to these planes, for example through fluid supply holes in the anode array, cathode, or both; this perpendicular flow may be more effective in some situations and it may improve bubble removal. One or more embodiments may incorporate features such as ridges into the surface of the anode array that are aligned with the fluid flow to improve flow and bubble removal.

In some embodiments, it may be possible to deposit multiple materials onto the plate. For example, columns of one material may be extended by depositing a different material on top of the first material. One example of this would be a copper deposit capped with a solder material (tin or tin alloy for instance). These different materials may be deposited by moving the substrate from one machine to another, each equipped with a different material, or the process may for example use parallel fluid handling systems with independent components for each type of material when material incompatibility issues preclude the use of shared components for the materials. For instance, each material may be housed in a separate tank and may have separate temperature control, filtration, pH management, etc. In addition, a fluid purge system may be utilized to flush the shared components (build chamber, electrode array) and between material swaps. This system could for example be a clean water supply that rinses the system to a collection vessel or drain. In some embodiments, multiple build chambers may be employed, for example by moving the plate between build chambers.

A control system, which may include processor 222, may collect sensor information, and carry out the deposition of structures as dictated by a build plan which is entered prior to deposition. The control system may ingest data from the electrolyte bath monitoring equipment, mechanical positioning sensors, and plating power systems. For example, voltage and current may be measured at the system level (bulk) and/or at each individual anode, or at some subset of anodes.

This collected information may be used as part of an automated build quality determination process. For example, this information may be used to determine if a feature broke or failed to form properly during the build process and thus report manufacturing yield without a subsequent inspection step.

In a typical deposition cycle the control system may set current and/or voltage of each anode element in accordance with the build plan, position the anode array relative to the plate, engage the pump to cause solution flow and measure the current, voltage, and deposition time both at each individual anode and of the system as a whole. When certain thresholds are met, for instance a calculated charge (anode current over time), or current/voltage spikes indicate a short circuit, the system may deactivate certain anodes and/or reposition the anode array relative to the plate to continue the process. At certain points in the build process the mechanical system may purposefully increase the gap to facilitate greater fluid velocity, for example to enable clearing of generated gas bubbles and/or refreshing the electrolyte in the active build area.

In another embodiment, an additional anode may be in fluid contact with the plating cell which is used to sequentially deposit the bath material onto the anode array. This modifies the surface of the anode array from an insoluble electrode material to a soluble one and can be beneficial to reducing secondary gas formation, the reduction of undesirable secondary reactions, and/or increase the lifetime of the anode themselves.

In some situations, when a plate is left sitting in the electrolyte solution, the deposit may be slowly etched by the plating bath, effectively undoing the deposition. To counteract this effect, one or more embodiments may use any of several techniques to maintain a cathodic potential on the cathode and avoid material loss. The first technique may use a sacrificial zinc anode which is bonded electrically to the cathode and is placed into the bath. The zinc component dissolves into solution more readily than a copper deposit and therefore protects the deposit. This may be incorporated with a secondary bath and salt bridge/ion membrane to avoid zinc ions contaminating the bath. Another technique may use active cathode current protection. In this method, the potential of the cathode may be maintained at a level slightly lower than the anodes and electrolyte to ensure that a constant but very small forward current is always acting on the cathode.

Illustrative materials targeted for deposition are In, Cu, Sn, Ni, Co, Ag, Au, Pb, and alloys of these materials such as SnAg, NiCo. Additives may be used in the electrolyte chemistry to improve deposit qualities such as surface finish, density, residual stresses, etc. For example, in one or more embodiments suppressing additives may be added to the electrolyte. These additives may function to slow or stop deposition from occurring on the lower current density regions on the cathode. This may be useful because it may allow for a more distinct edge at the base of the deposit. Without these suppressing additives, a more diffused edge may occur at the base of each deposit Though the process may eliminate the need for the photomasking steps on the plate, a photomasking step may also be employed in one or more embodiments to help improve the resolution and initial formation of the structures.

Figure 19:
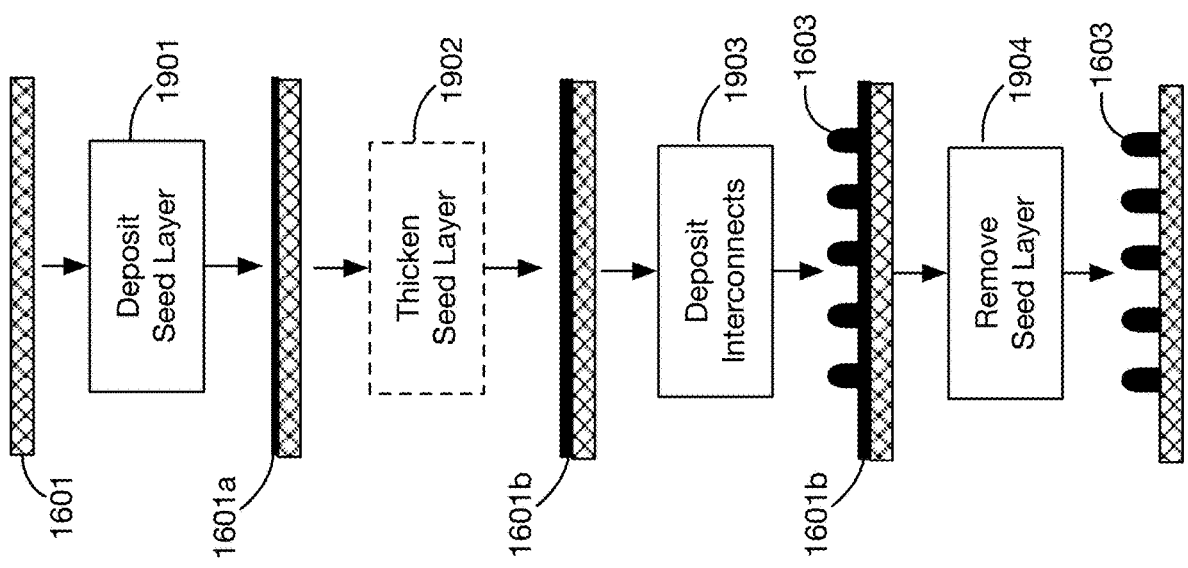
FIG. 19 shows illustrative steps in a process to add interconnection features to a plate, which builds these features on top of a seed layer that is then removed.

One or more embodiments may deposit interconnection features onto a conductive seed layer that is placed onto the plate. An illustrative set of steps using the seed layer are shown in FIG. 19. Step 1901 deposits an initial conductive seed layer 1601a onto plate 1601. This step may be performed using physical vapor deposition ("PVD"), for example. In one or more embodiments, this initial seed layer 1601a may be thinner than a normally deposited seed layer used in wafer plating applications. The layer may then be thickened in step 1902 using electrochemical deposition, by placing the plate and the seed layer into the electrolyte solution and plating the entire seed layer with material to thicken it, resulting in a thickened conductive seed layer 1601b. Potential benefits of using a thin initial seed layer and then thickening it via electrodeposition may include reducing PVD tool usage for seed layer deposition, having greater control over the thickness of the seed layer, being able to vary the thickness of the seed layer across the substrate, being able to achieve thicker seed layers than are feasibly deposited in a PVD process, and construction of multi-material seed layers. Step 1903 then deposits interconnection features such as bump 1603 onto the thickened conductive seed layer 1601b, as described above. Finally, step 1904 removes the seed layer between the interconnection structures, so that the individual interconnects are electrically isolated.

Figure 20A:
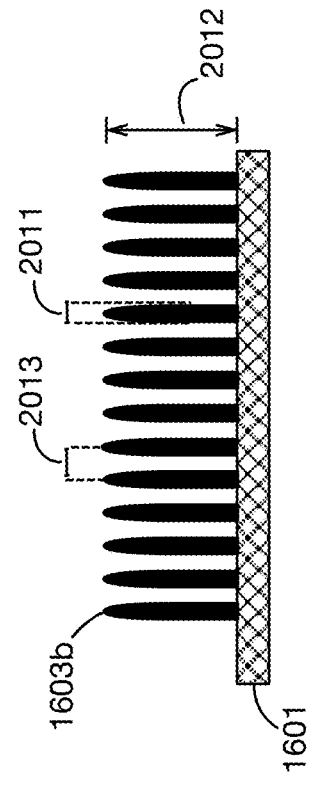
FIG. 20A shows an illustrative profile of wafer bumps.
Figure 20B:
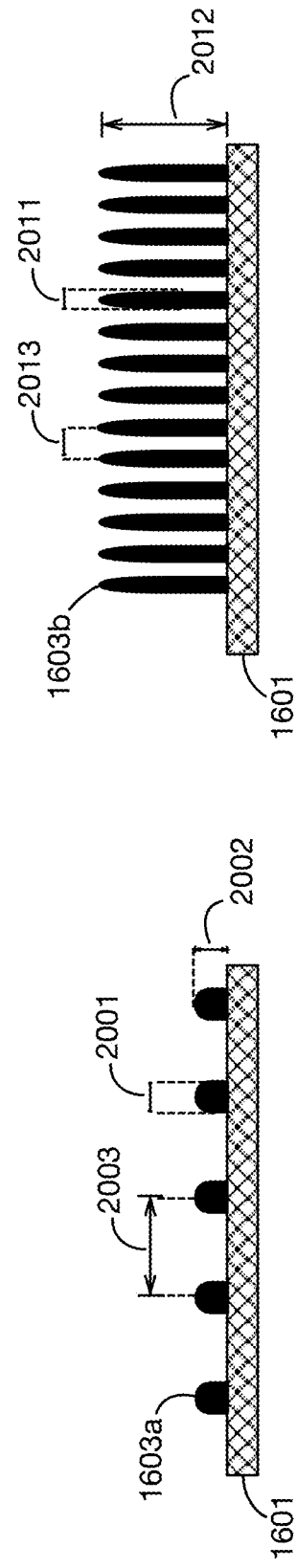
FIG. 20B shows an illustrative profile of taller and denser features that may be added using an embodiment of the invention.
Figure 20C:
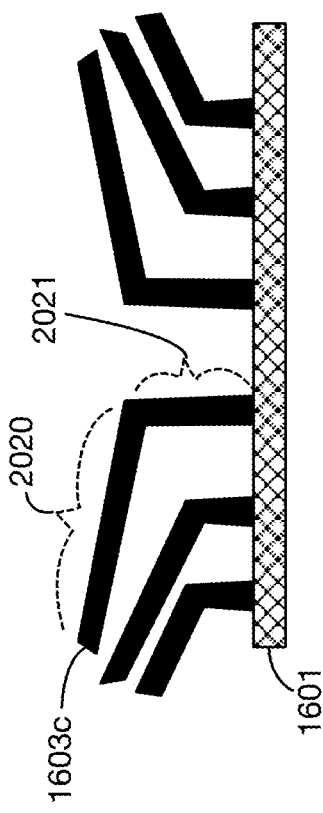
FIG. 20C shows illustrative features with horizontal sections that may be generated using an embodiment of the invention.

FIGS. 20A, 20B, and 20C show illustrative benefits of using electrodeposition to construct interconnection structures compared to the existing art. FIG. 20A shows illustrative wafer bumps or pillars such as pillar 1603a that may be constructed using electrodeposition or the existing art, using for example a photoresist-based process. Three important dimensions include the pillar diameter 2001, the pillar height 2002, and the inter-pillar spacing 2003 (between centers). For typical state-of-the-art processing using photoresist, pillar diameter 2001 is approximately 50 µm, pillar height 2002 is approximately 50 µm to 100 µm, and pillar spacing 2003 is approximately 100 µm. FIG. 20B shows illustrative dimensions that may be achievable using one or more embodiments of the invention for deposition of interconnection structures such as pillar 1603b: pillar diameter 2011 may be below 10 µm, pillar height 2012 may be 200 µm or more for a 10 µm diameter, and pillar spacing 2013 may be as low as 10 µm to 20 µm. These values represent substantial improvement over the existing art, with taller and smaller diameter pillars that are spaced closer together. The pillar aspect ratio (height to diameter) achievable using one or more embodiments of the invention may be greater than 10:1, which may be unachievable using photoresist-based processes due to limitations in how thickly the photoresist can be applied and exposed.

FIG. 20C shows another illustrative benefit of one or more embodiments of the invention: interconnection structures may include shapes with diagonal, slanted, or horizontal sections. Typical wafer bumps used in the art rise perpendicularly to the surface of the semiconductor die. These vertical structures allow connection of die pads to connection points directly across the location of the corresponding die pad locations. However, in some situations it may be advantageous to have non-vertical interconnection features. Because of the flexibility of the electrochemical additive manufacturing process, die pad connecting structures are not limited to simple vertical columns. In some embodiments, horizontal structures can be fabricated to connect widely separated signals. This can be done for many reasons, including customizing chips based on the same die, interconnecting widely separated signals not amenable to on-die interconnect, etc. For example, these techniques may be used to bring die signals out to the edge of the package for connection convenience. In some embodiments, one or more columns may be angled instead of being vertical to the die surface. For example, some or all of the columns may be angled in the same direction to horizontally offset the die from the resulting connection points. In some embodiments, some columns may be angled away from each other (splayed out) to create connection points that are separated farther apart than the pads on the die are separated. In the illustrative example shown in FIG. 20C, pillar 1603*c* has a vertical section 2021 connected to a largely horizontal section 2020; this geometry moves the connection points to the edges of the plate. Non-vertical geometries may also be beneficial for heat sink structures, which may be constructed on plates instead of or in addition to interconnection structures. In some embodiments, heat sinks may be electrodeposited onto either or both sides of an integrated circuit die, either in conjunction with interconnect structure deposition or independently.

Figure 21:
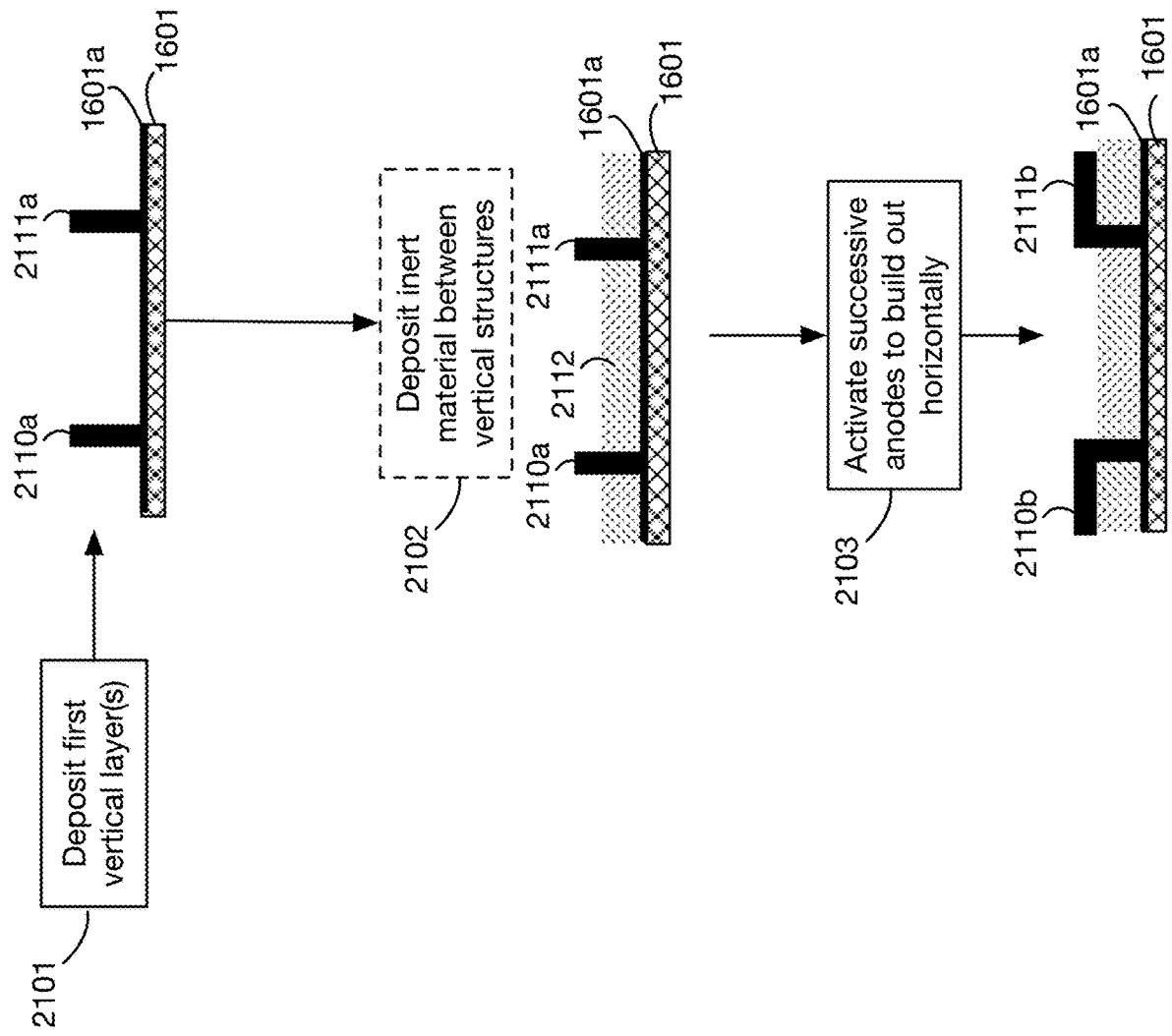
FIG. 21 shows illustrative steps that may be used in one or more embodiments to construct horizontal features such as those shown in FIG. 20C.

FIG. 21 shows illustrative techniques that may be used in one or more embodiments to construct horizontal (or slanted, non-vertical) segments of interconnection features or heat sink features, such as those shown in FIG. 20C. Initially, step 2101 deposits vertical sections of the features, such as sections 2110*a* and 2111*a*, onto plate 1601, which may have a conductive seed layer 1601*a*. Horizontal sections 2110*b* and 2111*b* may then be deposited using successive activation 2103 of selected anodes to build the features horizontally parallel to the anode array. This process is described above for example with respect to FIG. 6. In some embodiments, an active anode (or anodes) is activated until a current short is observed. At that point, the currently active anode(s) are deactivated and then subsequent anodes are activated to continue the structure.

Creating horizontal structures may introduce overhang effects, especially if the resulting structure is long and thin. When creating such 3D interconnect structures, overhang effects may be ameliorated through many techniques, for example, techniques that reduce the stress experienced by the overhanging structure. Performing the deposition in a microgravity environment is one possible way to avoid the stress due to gravity. Other techniques are also possible.

To reduce overhang stress in some embodiments, a multi-material build can be performed, with or without material removal between steps. For example, in one or more embodiments the manufacturing process may build columns, pot (fill with inert material such as epoxy or the like) to the column top, then build horizontal structures and more columns, pot again, build orthogonal horizontal structures, etc. This technique is shown in FIG. 21 as step 2102, which deposits inert material 2112 around the vertical columns 2110*a* and 2111*a*. This inert material then provides support for the horizontal structures 2110*b* and 2111*b* constructed in step 2103.

While the invention herein disclosed has been described by means of specific embodiments and applications thereof, numerous modifications and variations could be made thereto by those skilled in the art without departing from the scope of the invention set forth in the claims.

What is claimed is:

1. A method of electrochemical additive manufacturing of interconnection features each having multiple layers, comprising:
    obtaining a plate comprising one or more tiles, each tile of said one or more tiles comprising an electrical circuit, which comprises one or more electrical connection points, wherein said plate further comprises a conductive seed layer;
    electrically coupling said conductive seed layer to a power supply;
    placing a surface of said conductive seed layer in contact with an electrolyte solution;
    placing an anode array in contact with said electrolyte solution, wherein:
        said anode array comprises a plurality of deposition anodes; and
        each deposition anode of said plurality of deposition anodes is configured to independently provide current that flows from said power supply through said deposition anode to said plate through said electrolyte solution, resulting in deposition of material onto said plate;
    aligning said plate and said anode array;
    obtaining a build plan that comprises a layer description of each layer of the interconnection features; and
    manufacturing each layer of the multiple layers of one or more of the interconnection features, each electrically coupled to a corresponding electrical connection point of said one or more electrical connection points of the electrical circuit of said each tile, wherein said manufacturing said one or more interconnection features comprises controlling an amount of said current that flows from said each deposition anode to deposit said material onto said plate to form said one or more interconnection features, and manufacturing each layer of each one of the one or more interconnection features comprises:
        setting or confirming a position of the cathode relative to the anode array to begin the manufacturing of the layer;
        transmitting control signals to the anode array based on a layer description of the layer;
        measuring one or more feedback signals across the anode array;
        analyzing the one or more feedback signals to produce a deposition analysis that comprises an extent to which deposition has progressed at one or more locations within the layer, wherein analyzing the one or feedback signals comprises applying one or more transformations to the feedback signals, wherein the one or more transformations comprise one or more of morphological filters and Boolean operations; and
        continuing or completing manufacturing of the layer in response to the deposition analysis,
    wherein manufacturing the one or more interconnection features further comprises, while maintaining contact between the anode array and the electrolyte solution, manufacturing a plurality of layers of the one or more interconnection features by depositing the material onto the plate to form a first one of the plurality of layers, having a raw surface, and depositing the material directly onto the raw surface of the first one of the plurality of layers to form a second one of the plurality of layers.

2. The method of claim 1, wherein said one or more interconnection features comprise one or more wafer bumps.

3. The method of claim 1, wherein said one or more interconnection features comprise one or more pillars.

4. The method of claim 1, wherein said aligning said plate and said anode array comprises:
    using one or more sensors to determine a three-dimensional position and a three-dimensional orientation of said plate relative to said anode array; and using one or more actuators to set or modify said three-dimensional position and said three-dimensional orientation of said plate relative to said anode array.

5. The method of claim 1, further comprising removing portions of said conductive seed layer not covered by said one or more interconnection features.

6. The method of claim 1, further comprising controlling said amount of said current that flows from said each deposition anode to increase a thickness of said conductive seed layer in one or more regions of said plate.

7. The method of claim 1, wherein one or more of said one or more interconnection features comprise portions that are not perpendicular to said plate.

8. The method of claim 7, further comprising successively activating horizontally offset anodes of said plurality of deposition anodes to construct said portions that are not substantially perpendicular to said plate.

9. The method of claim 8, further comprising:
constructing vertical portions of said one or more of said one or more interconnection features that are substantially perpendicular to said plate;
depositing an inert material onto said plate between said vertical portions; and
activating said horizontally offset anodes after said depositing said inert material.

10. The method of claim 1, wherein:
said material comprises a first material and a second material; and
said deposit said material onto said plate to form said one or more interconnection features comprises:
deposit said first material onto said plate; and
deposit said second material on top of said first material.

11. The method of claim 10, wherein:
said first material comprises copper; and
said second material comprises one or more of tin, silver, or lead.

12. The method of claim 1, wherein:
said plate comprises two or more tiles; and
said manufacturing said one or more interconnection features further comprises using one or more actuators to position said anode array proximal to each tile of said two or more tiles to manufacture interconnection features associated with said each tile.

13. The method of claim 1, wherein said manufacturing said one or more interconnection features further comprises:
obtaining a build plan that comprises a layer description of each layer of the plurality of layers of said one or more interconnection features, wherein the layer description comprises:
a target map comprising a desired presence or absence of the material at a plurality of locations within an associated layer; and
one or more process parameter values that affect a manufacturing process for the associated layer,
wherein manufacturing each layer of the plurality of layers further comprises:
setting or confirming a position of the plate relative to the anode array to begin the manufacturing of the layer;
transmitting control signals to the anode array based on the layer description of the layer;
measuring one or more feedback signals across the anode array;
analyzing the one or more feedback signals to produce a deposition analysis that comprises an extent to which deposition has progressed at the plurality of locations within the layer;
determining whether deposition of the layer is complete based on the deposition analysis;
when deposition of the layer is not complete, determining whether to modify one or more of the one or more process parameter values associated with the layer; and
when deposition of the layer is complete and when a subsequent layer of the plurality of layers has not been manufactured, manufacturing the subsequent layer.

14. The method of claim 13, wherein the one or more feedback signals comprise a map of current across the anode array.

15. The system of claim 13, wherein manufacturing a layer of the plurality of layers further comprises calculating a map of desired current output from each deposition anode of the anode array that will generate deposition that corresponds to the target map associated with the layer.

16. The method of claim 15, wherein calculating the map of desired current output from each deposition anode comprises applying one or more transformations to the target map associated with the layer.

17. The method of claim 13, wherein manufacturing the layer of the plurality of layers further comprises performing one or more maintenance actions to maintain the condition of one or more of the anode array and the electrolyte solution.

18. The method of claim 17, wherein the one or more maintenance actions comprise replacing material onto one or more deposition anodes that have eroded.

19. The method of claim 17, wherein the one or more maintenance actions comprise activating one or more deposition anodes onto which a film has formed to cause removal of the film.

20. The method of claim 17, wherein the one or more maintenance actions comprise removal of bubbles from the electrolyte solution.

21. A method of electrochemical additive manufacturing of interconnection features each having multiple layers, comprising:
obtaining a plate comprising one or more tiles, each tile of said one or more tiles comprising an electrical circuit, which comprises one or more electrical connection points, wherein said plate further comprises a conductive seed layer;
electrically coupling said conductive seed layer to a power supply;
placing a surface of said conductive seed layer in contact with an electrolyte solution;
placing an anode array in contact with said electrolyte solution, wherein:
said anode array comprises a plurality of deposition anodes; and
each deposition anode of said plurality of deposition anodes is configured to independently provide current that flows from said power supply through said deposition anode to said plate through said electrolyte solution, resulting in deposition of material onto said plate;
aligning said plate and said anode array;
obtaining a build plan that comprises a layer description of each layer of the interconnection features; and
manufacturing each layer of the multiple layers of one or more of the interconnection features, each electrically coupled to a corresponding electrical connection point of said one or more electrical connection points of the electrical circuit of said each tile, wherein said manufacturing said one or more interconnection features comprises controlling an amount of said current that flows from said each deposition anode to deposit said material onto said plate to form said one or more interconnection features, and manufacturing each layer of each one of the one or more interconnection features comprises:
- setting or confirming a position of the cathode relative to the anode array to begin the manufacturing of the layer;
- transmitting control signals to the anode array based on a layer description of the layer;
- measuring one or more feedback signals across the anode array;
- analyzing the one or more feedback signals to produce a deposition analysis that comprises an extent to which deposition has progressed at one or more locations within the layer, wherein analyzing the one or feedback signals comprises applying one or more transformations to the feedback signals, wherein the one or more transformations comprise one or more of morphological filters and Boolean operations; and
- continuing or completing manufacturing of the layer in response to the deposition analysis.

22. A method of electrochemical additive manufacturing of interconnection features each having multiple layers, comprising:
- obtaining a plate comprising one or more tiles, each tile of said one or more tiles comprising an electrical circuit, which comprises one or more electrical connection points, wherein said plate further comprises a conductive seed layer;
- electrically coupling said conductive seed layer to a power supply;
- placing a surface of said conductive seed layer in contact with an electrolyte solution;
- placing an anode array in contact with said electrolyte solution, wherein:
  - said anode array comprises a plurality of deposition anodes; and each deposition anode of said plurality of deposition anodes is configured to independently provide current that flows from said power supply through said deposition anode to said plate through said electrolyte solution, resulting in deposition of material onto said plate;
- aligning said plate and said anode array; and
- manufacturing each layer of the multiple layers of one or more of the interconnection features, each electrically coupled to a corresponding electrical connection point of said one or more electrical connection points of the electrical circuit of said each tile, wherein said manufacturing said one or more interconnection features comprises controlling an amount of said current that flows from said each deposition anode to deposit said material onto said plate to form said one or more interconnection features, wherein the current that flows through each one of the plurality of deposition anodes is continuously variable from zero to a maximum value,
- wherein: each layer of the multiple layers of at least a first one of the interconnection features is formed from deposition of material onto said plate via the current that flows through at least four adjacent ones of the plurality of deposition anodes; and
- the current that flows through a first two diagonally adjacent ones of the at least four adjacent ones of the plurality of deposition anodes alternates with the current that flows through a second two diagonally adjacent ones of the at least four adjacent ones of the plurality of deposition anodes.

* * * * *